(12) United States Patent
Martens et al.

(10) Patent No.: US 12,379,416 B2
(45) Date of Patent: *Aug. 5, 2025

(54) SOLENOID SYSTEM WITH POSITION AND TEMPERATURE DETECTION

(71) Applicant: Maxim Integrated Products, Inc., San Jose, CA (US)

(72) Inventors: Onno Martens, Hamburg (DE); Lars Larsson, Hamburg (DE); Christof Heilemann, Hamburg (DE)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/617,002

(22) Filed: Mar. 26, 2024

(65) Prior Publication Data
US 2024/0230763 A1 Jul. 11, 2024

Related U.S. Application Data

(63) Continuation of application No. 17/579,574, filed on Jan. 19, 2022, now Pat. No. 11,977,119.
(Continued)

(51) Int. Cl.
*G01R 31/327* (2006.01)
*H01F 7/06* (2006.01)
*H01F 7/08* (2006.01)

(52) U.S. Cl.
CPC ......... *G01R 31/3278* (2013.01); *H01F 7/064* (2013.01); *H01F 7/081* (2013.01)

(58) Field of Classification Search
CPC ........ G01R 17/00; G01R 19/04; G01R 19/10; G01R 31/72; G01R 31/3278; G01R 19/25;
(Continued)

(56) References Cited

U.S. PATENT DOCUMENTS 5,424,637 A 6/1995 Oudyn et al.
5,578,904 A 11/1996 Marcott et al.
(Continued)

OTHER PUBLICATIONS

"DRV8244-Q1 Automotive H-Bridge Driver with Integrated Current Sense and Diagnostics", Nov. 2021 (revised Dec. 2021), Texas Instruments Incorporated, https://www.ti.com/lit/ds/symlink/drv8244-q1.pdf? s=1643138121625.
(Continued)

*Primary Examiner* — Vinh P Nguyen
(74) *Attorney, Agent, or Firm* — Knobbe, Martens, Olson & Bear, LLP

(57) ABSTRACT

A solenoid system and method can include: providing an energizing voltage to a coil of a solenoid; providing an AC signal superimposed onto the energizing voltage; detecting current through the coil including an AC current amplitude induced by the AC signal and including a DC offset current amplitude; determining the AC current amplitude is a low AC current amplitude based on an armature within the solenoid being in a retracted position or determining the AC current amplitude is a high AC current amplitude based on the armature being in an extended position with the control logic, and where the AC current amplitude is determined utilizing the AC signal for synchronous demodulation; and determining a temperature fault based on the DC offset current amplitude falling below a DC offset current amplitude threshold.

15 Claims, 11 Drawing Sheets

Related U.S. Application Data

(60) Provisional application No. 63/142,653, filed on Jan. 28, 2021, provisional application No. 63/142,721, filed on Jan. 28, 2021.

(58) Field of Classification Search
CPC ...... G01R 19/1659; G01R 31/00; H02K 3/02; H02K 55/00; H02K 41/03; G01M 17/00; H02P 25/032; H03K 5/2472; H03K 3/017; H01F 7/06; H01F 7/08
See application file for complete search history.

(56) References Cited

U.S. PATENT DOCUMENTS

| | | | |
|---|---|---|---|
| 5,942,892 A | 8/1999 | Li | |
| 6,577,133 B1 | 6/2003 | Barron | |
| 6,889,121 B1 | 5/2005 | Shahroudi et al. | |
| 7,782,590 B2* | 8/2010 | Bedingfield | H01F 7/1844 |
| | | | 361/160 |
| 8,681,468 B2* | 3/2014 | Jacob | H01F 7/1844 |
| | | | 361/154 |
| 9,013,854 B2* | 4/2015 | Sagues | H01F 7/1805 |
| | | | 361/170 |
| 9,828,821 B2* | 11/2017 | Davis | E21B 34/066 |
| 10,497,501 B2* | 12/2019 | Chu | E21B 47/18 |
| 10,895,608 B2 | 1/2021 | Narayanasamy et al. | |
| 11,574,756 B2 | 2/2023 | Sengodan | |
| 11,977,119 B2* | 5/2024 | Martens | G01R 31/3278 |
| 2021/0134502 A1 | 5/2021 | Sengodan | |

OTHER PUBLICATIONS

"BTN8982TA High Current PN Half Bridge", May 17, 2013, Infineon Technologies AG, hllps://www.infineon.com/dgdl/ nfineon-BTN8982TA-DS-v01_00-EN.pdf?fileId=db3a30433fa9412ffi13fbe32289b7c17.

Balakrishnan et al., "TI Designs, Current Controlled Driver for AC Solenoids", Nov. 2014 (revised Feb. 2017), Texas Instruments Incorporated, https:/lwww.ti.com/lil/ug/tidu584a/tidu584a.pdf.

* cited by examiner

SOLENOID SYSTEM WITH POSITION AND TEMPERATURE DETECTION

TECHNICAL FIELD

This disclosure relates to electric solenoids, more particularly to electric solenoids implementing position and temperature detection.

BACKGROUND

Massive trends toward automation are underway in many industries, including manufacturing, health care, and automotive. This automation relies heavily on the electric solenoid, which provides a binary, unidirectional movement, with limited reach.

Illustratively, electronic solenoids play an important role in the medical field where precise and accurate motion is required, such as during the operation of dialysis and dosing machines. Industrial manufacturing can require the precise actuation of tens or hundreds of electric solenoids, for example in textile manufacturing systems.

When used in industrial manufacturing, the malfunctioning of one electric solenoid can impact the quality of a product, can stop a production line, and can even present a risk to an operator. When used in the medical or security industries, the malfunctioning of an electric solenoid can result in loss of life.

Furthermore, as an extension of the electronics industry, electronic solenoids have come under ever-increasing commercial competitive pressures demanding miniaturized, feature rich, low cost, and low power solenoids. Current technical problems constraining electric solenoids include determining solenoid temperature and position without costly external sensors coupled to the solenoid.

The temperature of the solenoid is an important indicator of solenoid health, with temperature aberrations indicating a solenoid that might fail to provide repeatable motion and should be changed. Determining the accurate position of the solenoid is critical to controlling the precise actuation of the solenoid.

Ensuring precise repeatable solenoid movement is at the core of insertion strategies outlined in road maps for development of next generation products. Many of these products depend at least in part, on precision machining and miniaturization; both of which, demand control systems for electric solenoids in the sub-millimeter range. One previous attempt utilizes back-electromotive-forces (BEMF) generated by the movement of a solenoid plunger to determine motion. However, the BEMF alone does not provide a technical solution because the BEMF only provides an indication of solenoid movement, not position or temperature.

Other previous attempts use external sensors mounted to the solenoid for detecting attributes of the solenoid. These external sensors increase the control hardware footprint, increase costs for each solenoid monitored, increase power consumption, and many times require application specific engineering to ensure proper integration of the solenoid and sensors.

Furthermore, in many sterile or harsh environments, externally coupled sensors present a technical problem and cannot be used, as the external sensors would be exposed to the environment. Yet even further, external sensors and circuitry generally have large signal to noise ratios, and in some cases, detection might require enough power to affect the motion of the solenoid during measurement, which can create motion artifacts in an otherwise smooth solenoid motion.

These previous attempts to precisely control and monitor the electric solenoid have failed to provide a full solution for lower power, low cost, and integrated internal position and temperature measurements that the industry demands. In view of the ever-increasing commercial competitive pressures, along with growing consumer expectations and the diminishing opportunities for meaningful product differentiation in the marketplace, it is critical that answers be found for these problems.

Thus, a need remains for electronic solenoid with internal position and temperature measurements. Solutions to these problems have been long sought but prior developments have not taught or suggested any complete solution and, thus, solutions to these problems have long eluded those skilled in the art.

BRIEF DESCRIPTION OF THE DRAWINGS

The solenoid system is illustrated in the figures of the accompanying drawings which are meant to be exemplary and not limiting, in which like reference numerals are intended to refer to like components, and in which.

DETAILED DESCRIPTION

Figure 1:
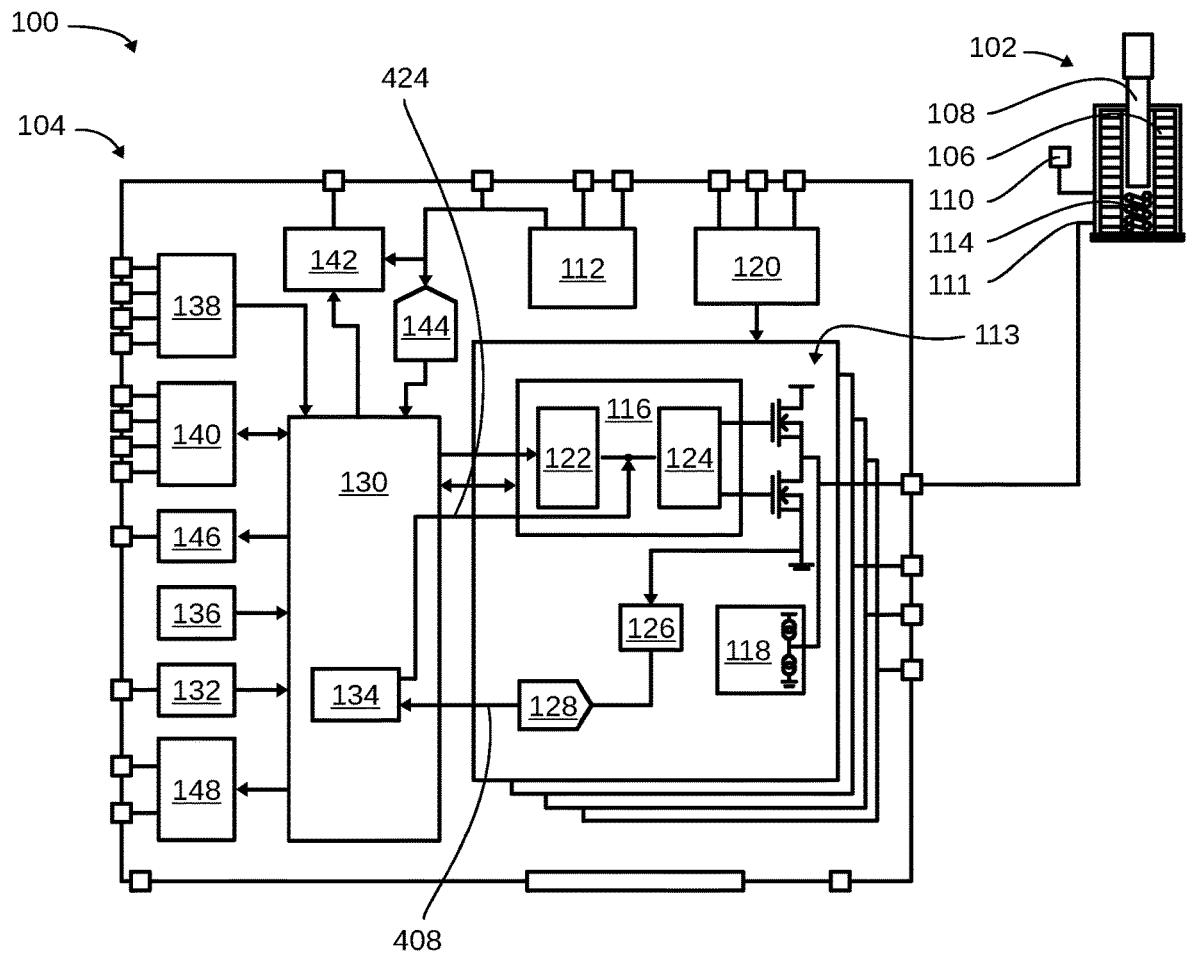
FIG. 1 is a block diagram of the solenoid system in a position and temperature detection embodiment.

In the following description, reference is made to the accompanying drawings that form a part hereof, and in which are shown by way of illustration, embodiments in which the solenoid system may be practiced. It is to be understood that other embodiments may be utilized and structural changes may be made without departing from the scope of the solenoid system.

When features, aspects, or embodiments of the solenoid system are described in terms of steps of a process, an operation, a control flow, or a flow chart, it is to be understood that the steps can be combined, performed in a different order, deleted, or include additional steps without departing from the solenoid system as described herein.

The solenoid system is described in sufficient detail to enable those skilled in the art to make and use the solenoid system and provide numerous specific details to give a thorough understanding of the solenoid system; however, it will be apparent that the solenoid system may be practiced without these specific details.

In order to avoid obscuring the solenoid system, some well-known system configurations and descriptions are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the solenoid system can be operated in any orientation. As used herein, the term couple, as in "coupled" or "coupling" is defined as an electrical connection between coupled elements.

Referring now to FIG. 1, therein is shown a block diagram of the solenoid system 100 in a position and temperature detection embodiment. The solenoid system 100 is depicted having a solenoid 102 coupled to an integrated solenoid driver 104.

The solenoid 102 can be an electromechanical component comprising a coil 106 with an armature 108 that moves or otherwise imparts mechanical force in response to a magnetic field generated by passing current through the coil 106. One skilled in the art will appreciate that other words may be used to describe the armature 108 including but not limited to a piston, an actuator, a movable core, a movable slug, and a plunger. For descriptive clarity, hereinafter the armature 108 will be referred to as plunger 108.

When the coil 106 is actuated by applying a voltage to the coil 106 of the solenoid 102, the plunger 108 is either extended out of the coil 106 or retracted into the coil 106 depending on current direction and system assembly.

The position the plunger 108 takes when current is passed through the coil 106 is actuated is the actuated position. The solenoid 102 is shown having a first connection 110 and a second connection 111. The first connection 110 can be coupled to VM, which can be a motor drive voltage larger than supply voltage Vdd 112, while the second connection 111 can be coupled to a half bridge 113 contained within the integrated solenoid driver 104.

Although the first connection 110 of the solenoid 102 is described as connected to VM, it is contemplated that the first connection 110 could alternatively be connected to ground when other half bridge configurations are used. Still further, it is contemplated that the first connection 110 could alternatively be connected to a second half bridge to form a full H-bridge for the coil 106.

The solenoid 102 can further include a spring 114 for providing mechanical resistance against the motion of the plunger 108 and to limit the retraction or extension of the plunger 108 within the solenoid 102 during actuation. Both extension and retraction types of solenoids are contemplated and can be adapted. These types of solenoids differ in the location of the spring 114 and design of the plunger 108. Rotary solenoids are yet a further contemplated implementation, again differing in the location and design of the spring 114 and also in the type of movement produced.

The integrated solenoid driver 104 can include a switch controller 116 coupled to the solenoid 102 through the half bridge 113. The switch controller 116 is to be understood herein as a physical structural component at least having structural low power inputs and higher power outputs. Isolation for protecting delicate control circuitry is also a common structural component of switch controllers 116. The switch controller 116 is typically referred to as a gate driver and for ease of description, the switch controller 116 will be referred to as hereinafter as gate driver 116.

Illustratively for example, the gate driver 116 is depicted as a high-side low-side PWM driver. The gate driver 116 can control the half bridge 113 with a pulse-width-modulated (PWM) signal in order to provide voltages to the solenoid 102. The gate driver 116 can be implemented as dedicated ICs, discrete transistors, or transformers. The gate driver 116 can also be integrated within a larger IC or IC package.

The half bridge 113 is depicted having a high side N-Channel Depletion MOSFET and a low side N-Channel Depletion MOSFET. It is alternatively contemplated that the half bridge 113 could also be implemented using insulated-gate bipolar transistors (IGBTs) or one low side N-Channel Depletion MOSFET and one high side P-Channel Depletion MOSFET, for example. The solenoid 102 can be coupled to the source of the high side MOSFET and coupled to the drain of the low side MOSFET.

The N-Channel Depletion MOSFET is a depletion-mode MOSFET device which can be doped so that a channel exists with zero volts between the gate and source. To control the channel, a negative voltage is applied to the gate, which functions as a normally closed switch. The half bridge 113 and the solenoid 102 can further be coupled to an open load 118.

The gate driver 116 can provide the PWM signal to the half bridge 113. The PWM signal can provide a duty cycle proportional to an energizing voltage 410, a hold voltage 412, and a disable voltage 414, all of FIG. 4, below. The gate driver 116 can also provide an adjustable ramp 416 of FIG. 4 from the disable voltage 414 to the energizing voltage 410 by varying the PWM signal. The drain of the high side N-Channel Depletion MOSFET can be coupled to VM in order to drive the high side N-Channel Depletion MOSFET positive with respect to the supply voltage Vdd 112. A charge pump 120 can optionally drive the high side of the half bridge 113.

Figure 4:
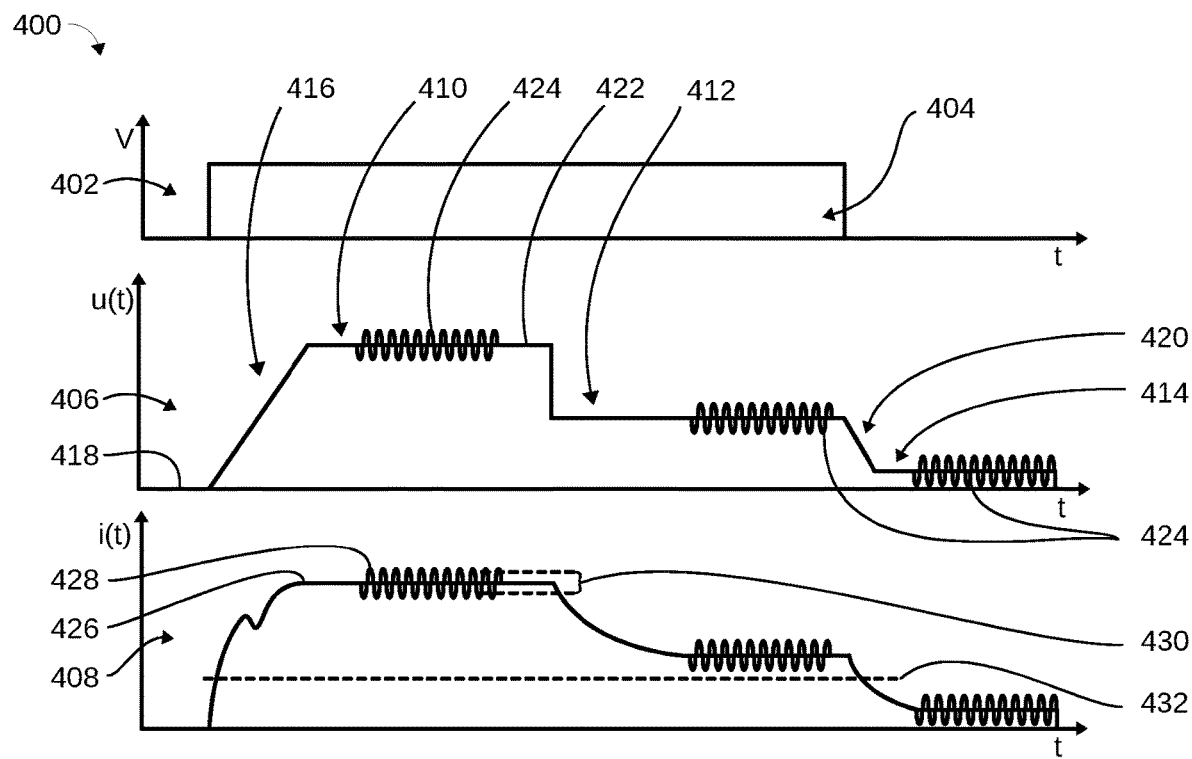
FIG. 4 is a first timing diagram for the solenoid system of FIG. 1.

The gate driver 116 can include a PWM ramping module 122. The PWM ramping module 122 generates the PWM duty cycle for the half bridge 113. An AC carrier signal 424 of FIG. 4 is added to the PWM duty cycle through superimposition. Illustratively for example, the frequency of PWM signal can be around 25 kHz, while the AC carrier signal 424 can be around 1 Hz to 1 kHz. It is contemplated that the frequency of the AC carrier signal 424 is programmable in the 1 Hz to 1 kHz range in order to cover a wide range of inductances from various different coils 106 in different solenoids 102, which could range from 1 mH to 1H.

It has been discovered that the AC carrier signal 424 signal being an order of magnitude lower than the PWM signal allows for very low amplitude of the AC carrier signal 424. This has been found to provide a great signal to noise ratio by enabling many readings to be averaged across a digital voltage signal 422 of FIG. 4 and also enables a very low power consumption with no residual oscillations felt on the solenoid 102. It has been further discovered that the AC carrier signal 424 with a 1 Hz to 1 kHz frequency can be used as a dithering signal to overcome breakaway torques due to static friction within the solenoid 102. This use of the AC carrier signal 424 as a dithering signal can be useful for valves, but also for DC motors with brushes for smooth starting at low speeds.

The combined signal can be an input voltage 406 of FIG. 4, and is a combination of the digital voltage signal 422 and the AC carrier signal 424. The input voltage 406 is fed into a PWM modulator 124 within the gate driver 116. The PWM modulator 124 generates the switching signal for high side and low side of the half bridge 113.

The integrated solenoid driver 104 can further include a current sensor 126 coupled to the solenoid 102. The current sensor 126 can detect current through the coil 106 of the solenoid 102 as an analog current signal.

The current sensor 126 is to be understood herein as a physical structural component at least having structural input and output connections. However, many forms of the current sensor 126 are contemplated including Hall effect linear sensors, galvanically isolated sensors, or GMR-based sensors. Yet other forms are contemplated including fluxgate sensors, shunt resistors, and even fiber optic interferometer based sensors.

The integrated solenoid driver 104 can further include an analog to digital converter 128 for converting the analog current signal to a digital current signal 408 of FIG. 4, prior to distributing the digital current signal 408 to control logic 130. The control logic 130 can be a digital computational block for performing Voltage Divider Rule (VDR) and Current Divider Rule (CDR) based calculations.

The half bridge 113, the gate driver 116, the open load 118, the PWM ramping module 122, the PWM modulator 124, the current sensor 126, and the analog to digital converter 128 can be reproduced for multiple solenoids 102. As shown, the half bridge 113, the gate driver 116, the open load 118, the PWM ramping module 122, the PWM modulator 124, the current sensor 126, and the analog to digital converter 128 are reproduced for coupling to four solenoids 102.

The control logic 130 is to be understood herein as a physical structural component at least having transistor logic gates for providing computation and control. Furthermore, the control logic 130 includes structural inputs and outputs typically operating between zero and five volts. It is contemplated that the control logic 130 can be a TTL or CMOS based architecture but could also include other logic families including RTL, DTL, and ECL, for example.

The control logic 130 can be coupled to the current sensor 126 through the analog to digital converter 128 and detect the digital current signal 408. The control logic 130 can compare the digital current signal 408 with a reference current 132 to provide a highly accurate current reading.

The control logic 130 can provide the AC carrier signal 424 to the gate driver 116 to be superimposed onto the energizing voltage 410, the hold voltage 412, and the disable voltage 414.

Figure 2:
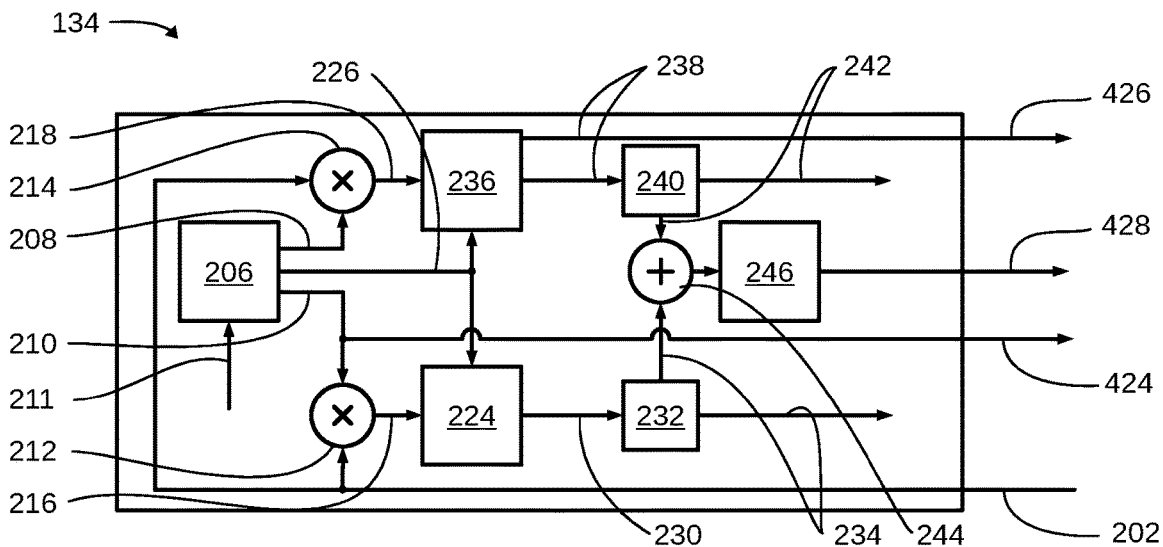
FIG. 2 is a block diagram of the AC carrier module of FIG. 1.

The control logic 130 can further include an AC carrier module 134. The AC carrier module 134 can be implemented as discrete components as depicted in FIG. 2 or by using distributed resources within the control logic 130. Furthermore, the AC carrier module 134 can be implemented utilizing instructions running on the control logic 130, which controls the technical process or the internal functioning of the control logic 130.

The AC carrier module 134 can both create the AC carrier signal 424 as well as determine an AC current amplitude 428 of FIG. 4 and a DC offset current amplitude 426 of FIG. 4. The AC carrier signal 424 is added to the PWM duty cycle through superimposition as shown between the PWM ramping module 122 and the PWM modulator 124. Both the AC current amplitude 428 and the DC offset current amplitude 426 are combined and contained within the digital current signal 408 from the analog to digital converter 128 and the current sensor 126. The solenoid 102 responds to the AC carrier signal 424 with a sinusoidal response signal, which is detected by the AC carrier module 134 as the AC current amplitude 428.

The AC carrier module 134 can synchronously demodulate the digital current signal 408 by utilizing the same frequency as the AC carrier signal 424 for providing a clean sample and an extremely accurate reading. The synchronous demodulation occurs over exactly one period of the AC carrier signal 424 or can occur over an integer multiple of the AC carrier signal 424. As such, the AC carrier module 134 can provide the AC current amplitude 428 reading every period of the AC carrier signal 424. And, as the AC carrier signal 424 will have many periods during the digital voltage signal 422, the AC carrier module 134 can utilize a series of samples during the digital voltage signal 422 to determine an average value, greatly increasing the signal to noise ratio.

It has been unexpectedly discovered that both the synchronous demodulation and the averaged samples unexpectedly and greatly increase signal to noises ratio. Due to this signal to noise ratio, these processes enable the use of very low amplitudes for the AC carrier signal 424. Low amplitudes can prevent a shaking solenoid and is possible because the signal to noise ratio is good enough that only a low AC amplitude is needed.

The amplitude and frequency of the AC carrier signal 424 can be easily parameterized to match solenoid characteristics and provide an even better signal to noise ratio. Specifically, a sweep over frequency and amplitude in both an extended position and a retracted position of the plunger 108 is made. During this sweep, the AC current amplitude 428 is measured and recorded. The combination with the highest signal to noise ratio should be chosen.

Once the AC carrier module 134 has sampled the digital current signal 408 and synchronously demodulated the digital current signal 408, the AC current amplitude 428 is determined together with the DC offset current amplitude 426. The AC current amplitude 428 represents the inductance response of the solenoid 102 while the DC offset current amplitude 426 can be proportional to the resistance of the coil 106.

If the AC current amplitude 428 is high, the inductance is low and when the AC current amplitude 428 is low, the inductance is high. That is, the AC carrier module 134 can determine the AC current amplitude 428 is a low AC current amplitude based on the plunger 108 being in a retracted position and determine the AC current amplitude 428 is a high AC current amplitude based on the plunger 108 being in an extended position.

Based on this determination of high or low values for the AC current amplitude 428, a binary signal indicating proper plunger 108 position can be determined. Illustratively for example, when the solenoid 102 is a retraction type solenoid, designed to retract when actuated, the control logic 130 can identify proper position of the plunger 108 when the low AC current amplitude is detected during an actuation duration 404 of FIG. 4. Alternatively, with the retraction type solenoid, the control logic 130 can identify improper position of the plunger 108 when the high AC current amplitude is detected during the actuation duration 404.

Furthermore, when the solenoid 102 is an extension type solenoid, designed to extend when actuated, the control logic 130 can identify proper position of the plunger 108 when the high AC current amplitude is detected during the actuation duration 404. Alternatively, with the extension type solenoid, the control logic 130 can identify improper position of the plunger 108 when the low AC current amplitude is detected during the actuation duration 404.

The high AC and low AC current amplitude can be determined by an AC amplitude threshold 430 of FIG. 4 or by comparing the AC current amplitude 428 to a previous value. The AC amplitude threshold 430 can be programmable trigger levels used to determine extended or retracted position of the plunger 108.

In one contemplated embodiment, the control logic 130 can instruct the gate driver 116 to modify the PWM signal to provide the hold voltage 412 or for dropping from the energizing voltage 410 to the hold voltage 412 based on the position of the plunger 108 being detected in the proper position during the actuation duration 404 as determined by the AC current amplitude 428.

That is, when the solenoid 102 is a retraction type solenoid, the control logic 130 can instruct the gate driver 116 to provide the PWM signal for driving the hold voltage 412 to the solenoid 102 based on the AC carrier module 134 detecting the low AC current amplitude during the actuation duration 404, which indicates the plunger 108 is properly in the retracted position. Furthermore, when the solenoid 102 is an extension type solenoid, the control logic 130 can instruct the gate driver 116 to provide the PWM signal for driving the hold voltage 412 to the solenoid 102 based on the AC carrier module 134 detecting the high AC current amplitude during the actuation duration 404, which indicates the plunger 108 is properly in the extended position.

As another result of the synchronous demodulation, the AC carrier module 134 determines the DC offset current amplitude 426, which is calculated as the mean value of the DC offset current amplitude 426 over one AC scan period. The resistance of the coil 106 can be calculated from the digital voltage signal 422 and the DC offset current amplitude 426. The resistance of the coil 106 should not change much from cycle to cycle unless there is a problem. The resistance of the coil 106 is proportional to a heat of the coil 106 and therefore can be used to determine the temperature of the coil 106. More particularly, the resistance of the coil 106 can follow Equation 1, as follows:

$$R = R0 + RT(T) \qquad \text{Equation 1}$$

where "R" is the resistance of the coil 106, "R0" is a fixed resistance of the coil 106, and "RT(T)" is a temperature induced resistance. A DC offset current amplitude threshold 432 of FIG. 4 is used to determine a temperature fault based on the DC offset current amplitude 426 falling below the DC offset current amplitude threshold 432.

It has been unexpectedly discovered that determining the temperature fault, as described, provides the ability to replace solenoids 102 prior to failure based only on operating parameters alone, and is accomplished without costly and complicated circuitry while simultaneously requiring no more power than originally is provided to the solenoid 102. This provides a technical advantage to solenoid systems employing the presently disclosed technical solutions by ensuring solenoids function properly and efficiently, at very low power requirements.

The control logic 130 can be coupled to and control the gate driver 116 with a control signal indicating a voltage level. The AC carrier module 134 can synchronously demodulate the AC current amplitude 428 utilizing the AC carrier signal 424, which can be based on the reference of an oscillator 136.

Thus, the solenoid system 100 including control logic 130 coupled to the gate driver 116 and coupled to the current sensor 126 provides the AC carrier signal 424 superimposed onto the energizing voltage 410, the hold voltage 412, and the digital voltage signal 422. It is contemplated that the AC carrier signal 424 could be superimposed onto one or any combination of the described voltages. And this AC carrier signal 424 can be used to sense the current through the coil 106 of the solenoid 102 including the AC current amplitude 428 and the DC offset current amplitude 426 which provides systems and methods of precise control and monitoring of the solenoid 102 that provides a full solution for lower power, low cost, and highly integrated internal position and temperature measurements, a solution not previously available in the electronic solenoid industry.

This solution is provided at least by enabling the determination of low AC current amplitude based on the plunger 108 being in a retracted position or the determination of high AC current amplitude based on the plunger 108 being in an extended position. This simple and cost effective solution unexpectedly provides a very low power solution by synchronously demodulating the sense input 202 of FIG. 2 signals for the data signal of the digital current signal 408, the digital current signal 408 including the DC offset current amplitude 426 and the AC current amplitude 428. Furthermore, the DC offset current amplitude 426 and the AC current amplitude 428 can be calculated using multiple readings and averaging the results which provides an unexpectedly large signal to noise ratio allowing even smaller AC carrier signal 424 amplitudes to be used and greatly reducing power consumption.

Thus, the solenoid system 100 provides systems and methods of precise control and monitoring of the solenoid 102 that provides a full solution for lower power, low cost, and integrated internal position measurements. The solenoid system 100 further provides systems and methods of precise control and monitoring of the solenoid 102 temperature measurements in that the DC offset current amplitude 426 can be precisely calculated and used to divide the input voltage 406 in determining the resistance of the coil 106 and thereby the temperature of the coil 106.

The information of plunger 108 position can be displayed to a user as the temperature of the solenoid 102. The integrated solenoid driver 104 is shown including input output modules for providing this position and temperature information.

Illustratively, the input output modules can include a control interface 138 having multiple control pins. The input output modules can also include a serial peripheral interface 140 for providing movement and duration information.

Another example of the input output modules can include a voltage input and output 142 having a linear voltage regulator and coupled to the control logic 130 with an enable control line. The control logic 130 can also be coupled to and monitor the supply voltage Vdd 112 through an analog-to-digital converter 144.

The control logic 130 can detect faults in the supply voltage Vdd 112 including under voltage lockout faults and over voltage threshold faults. The control logic 130 can also detect over current faults as well as faults based on the DC offset current amplitude 426 falling below the DC offset current amplitude threshold 432.

These faults can be output with a fault interface 146 coupled to the control logic 126. As yet another example of the input output modules, the control logic could be coupled to a multiplexed interface 148 having multiplexed input and output pins.

Referring now to FIG. 2, therein is shown a block diagram of the AC carrier module 134 of FIG. 1. The AC carrier module 134 is shown having a sense input 202. The sense input 202 can be a data signal of the digital current signal 408 of FIG. 4 including both the DC offset current amplitude 426 and the AC current amplitude 428, both of FIG. 4.

The digital current signal 408 can be centered around the frequency of the AC carrier signal 424 of FIG. 4. The sense input 202 can be coupled to the current sensor 126 through the analog to digital converter 128, both of FIG. 1.

The AC carrier module 134 is further shown having an AC carrier signal output that can communicate the AC carrier signal 424 from the AC carrier module 134 to the gate driver 116 of FIG. 1 for superimposition onto the PWM signal controlling the solenoid 102 of FIG. 1.

The AC carrier signal 424 can be generated by direct digital synthesizer 206. The direct digital synthesizer 206 can utilize a numerically controlled oscillator and a digital-to-analog converter to generate both a quadrature or sine component 208 of the AC carrier signal 424 as well as an in-phase or cosine component 210 of the AC carrier signal 424. The cosine component 210 is shown to be the AC carrier signal 424. The numerically-controlled oscillator component of the direct digital synthesizer 206 can have an AC frequency and voltage selection 211 as an input for providing an exact and predetermined AC carrier signal 424.

The cosine component 210 generated by the direct digital synthesizer 206 can be input into a first multiplier 212 together with the digital current signal 408 from the sense input 202. The sine component 208 generated by the direct digital synthesizer 206 also can be input into a second multiplier 214 together with the digital current signal 408 from the sense input 202.

The output signal from the first multiplier 212 and the second multiplier 214 includes sum frequency and difference frequency components.

The digital current signal 408 can have a frequency substantially similar to the frequency of the AC carrier signal 424 and therefore, the difference frequency result of the first multiplier 212 is a substantially DC X signal 216 and similarly, the difference frequency result of the second multiplier 214 is a substantially DC Y signal 218. The X signal 216 can be averaged in a first averaging block 224, which can sum the X signal 216 and divide by a number of samples. The first averaging block 224 can calculate an average of the X signal 216 by integrating the X signal 216 over exactly one period of the AC carrier signal 424. This has multiple advantages including the exclusion of frequencies other than the frequency of the AC carrier signal 424 which means filters are not needed. Furthermore, the result is available with a delay of one only one period of the AC carrier signal 424 in contrast to the phase delay of a filter which can be many periods and exhibit steep filter characteristics.

To facilitate the averaging of the X signal 216, the direct digital synthesizer 206 can output a sample and save signal 226 which controls the integration of samples within the first averaging block 224. More particularly, the sample and save signal 226 can be a single digit control signal, and for example, when "0", the sample and save signal 226 directs the first averaging block 224 to sample the X signal 216 producing an integral which can be divided by the number of samples to produce an average X signal 230.

Continuing with this example, when the sample and save signal 226 is a "1", the sample and save signal 226 also controls the saving of the calculated integral within an additional buffer register. The sample and save signal 226 can be "1" indicating a save for one sample clock. In this way, the buffer register always holds the last valid integration result of the X signal 216, which can be the output of the first averaging block 224 or the average X signal 230.

The average X signal 230 is squared in a first computational block 232, to produce an X squared signal 234. Similar to the X signal 216, the Y signal 218 can be averaged in a second averaging block 236.

That is, the second averaging block 236 can calculate an average of the Y signal 218 over exactly one period of the AC carrier signal 424 with the advantage that the result is available with a delay of one only one period of the AC carrier signal 424. The sample and save signal 226 controls the integration of samples within the second averaging block 236 by directing the second averaging block 236 to sample the Y signal 218 producing an integral which can be divided by the number of samples to produce an average Y signal 238.

Continuing with this example, when the sample and save signal 226 is a "1", the sample and save signal 226 also controls the saving of the calculated integral within an additional buffer register. The sample and save signal 226 can be "1" indicating a save for one sample clock. In this way, the buffer register always holds the last valid integration result of the Y signal 218, which can be the output of the second averaging block 236, namely the average Y signal 238.

The average Y signal 238 is the DC offset current amplitude 426, and can be squared in a second computational block 240, to produce a Y squared signal 242. The X squared signal 234 and the Y squared signal 242 can be added within an adder 244 then square-rooted within a third computational block 246 to produce the AC current amplitude 428.

It is contemplated that the AC carrier module 134 can be implemented in special purpose hardware or could utilize the logic gates of the control logic 130 of FIG. 1 in order to produce the same output values of the AC current amplitude 428 and the DC offset current amplitude 426, which can be illustrated with the following pseudo-code:

```
1    void sync_demodulation (int I_ACT, int angle)
2    {      // inputs: actual current and angle of AC_Scan signal
3         static long int accu_cos;
4         static long int accu_sin;
5         static long int accu_i;
6         static int cnt;
7
8         static int angle_old;
9
10        int Y, X;
11
12        // Detect: One Period of AC-Scan signal is done
13        if (angle_old < 0 && angle >= 0)
14        {
15           Y = accu_sin/cnt;
16           X = accu_cos/cnt;
17           I_DC = accu_i/cnt;
18           cnt = 0;
19
20           I_AC = sqrt (Y*Y + X*X);
21
22           accu_sin = 0;
23           accu_cos = 0;
24           accu_i = 0;
25        }
26
27        accu_cos += cos(angle) * I_ACT;
```

-continued

```
28        accu_sin += sin(angle) * I_ACT;
29        accu_i += I_ACT;
30        cnt++;
31        angle_old = angle;
32    }
```

As will be appreciated, the AC carrier module 134 can be implemented with minimal complexity and mathematics. Illustratively, only three accumulators are needed as is shown in lines 3 through 5 of the pseudo-code. Furthermore, the AC current amplitude 428 is calculated in line 20 while the DC offset current amplitude 426 is calculated for in line 17.

The AC carrier module 134 can therefore calculate the DC offset current amplitude 426 and the AC current amplitude 428 based on the sense input 202 transmitting the digital current signal 408. The digital current signal 408 is digitized information requiring digital logic to receive and cannot be understood by the unaided human mind.

Furthermore, the AC carrier module 134 can provide the DC offset current amplitude 426 and the AC current amplitude 428 for controlling the technical process and the internal functioning of the solenoids by reducing the input voltage 406 of FIG. 4 to the coil 106 of FIG. 1 of the solenoid 102 from the energizing voltage 410 of FIG. 4 to the hold voltage 412 of FIG. 4. Furthermore, the internal function of the solenoid 102 is controlled by generating faults if the DC offset current amplitude threshold 432 of FIG. 4 is exceeded or triggering other heat reduction measures for the solenoid 102 including powering the solenoid 102 off.

Thus, the solenoid system 100 of FIG. 1 provides systems and methods of precise control and monitoring of the solenoid 102 that provides a full solution for lower power, low cost, and integrated internal position and temperature measurements.

Figure 3:
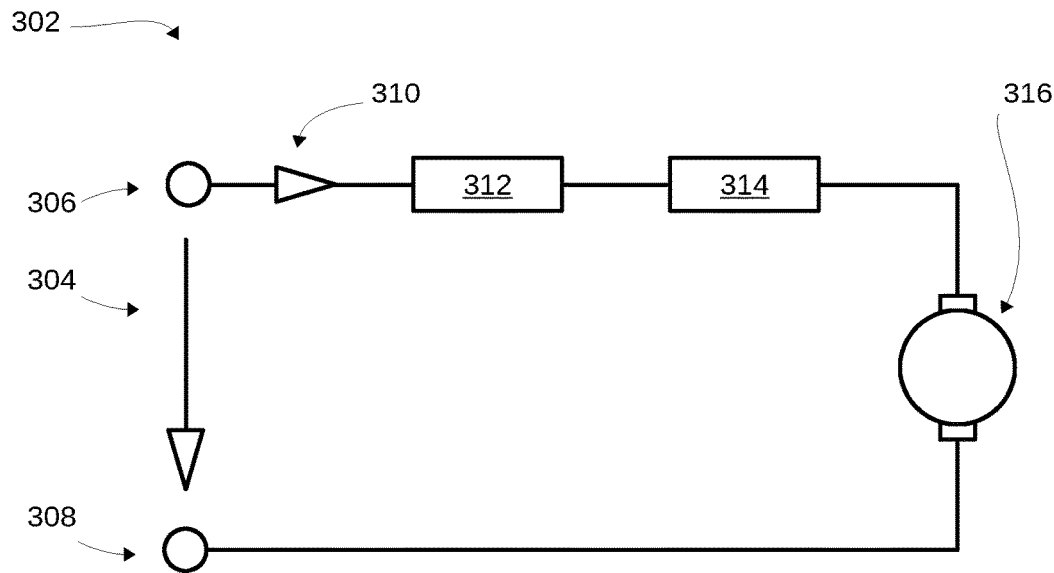
FIG. 3 is a block diagram of an equivalent circuit for the solenoid system of FIG. 1.

Referring now to FIG. 3, therein is shown a block diagram of an equivalent circuit 302 for the solenoid system 100 of FIG. 1. The equivalent circuit 302 can provide a representation of the solenoid 102 of FIG. 1 coupled to the integrated solenoid driver 104 of FIG. 1 and retains the electrical characteristics thereof. The equivalent circuit 302 enables resistances and inductances to be simplified for analysis.

The equivalent circuit 302 can provide a voltage represented as a step function, u(t) 304, across an input terminal 306 and an output terminal 308. The u(t) 304 is to be understood as the input voltage 406 of FIG. 4 to the coil 106 of FIG. 1, which can be the PWM controlled signal provided by the gate driver 116 of FIG. 1 from the output of the half bridge 113 of FIG. 1 including the AC carrier signal 424 of FIG. 4 from the AC carrier module 134 of FIG. 1.

The equivalent circuit 302 is also shown including a current i(t) 310 through an equivalent resistor 312, an equivalent inductor 314 and an equivalent solenoid 316. The i(t) can be the current through the coil 106 as detected by the current sensor 126 of FIG. 1 and can include the AC current amplitude 428 together with the DC offset current amplitude 426, both of FIG. 4.

The u(t) 304 can be equal to the voltage drop across the equivalent resistor 312 plus the voltage drop across the equivalent inductor 314 plus the BEMF produced by the equivalent solenoid 316 in motion. The BEMF voltage can be represented and calculated by a constant (Kemf) times the flux and speed of the equivalent solenoid 316.

Referring now to FIG. 4, therein is shown a first timing diagram 400 for the solenoid system 100 of FIG. 1. Movement of the solenoid 102 of FIG. 1 within the solenoid system 100 can be initiated by a control signal 402 from the control logic 130 of FIG. 1 and input into the gate driver 116 of FIG. 1. The control signal 402 can be a digital pulse specifying an actuation duration 404 during which one of the solenoids 102 will be actuated. The control signal 402 can further control which solenoid will be actuated when multiple solenoids are used.

The first timing diagram 400 further depicts an input voltage 406 and a digital current signal 408. The input voltage 406 can be the signal of voltage or u(t) 304 of FIG. 3 from the output of the half bridge 113 of FIG. 1. The digital current signal 408 can be the signal of current or i(t) 310 of FIG. 3 through the solenoid 102 as detected by the current sensor 122 of FIG. 1.

The control signal 402, the input voltage 406, and the digital current signal 408 are plotted with respect to a horizontal time axis. The control signal 402 and the input voltage 406 are plotted with respect to a vertical voltage axis, such as the u(t) 304 in the case of the input voltage 406. The digital current signal 408 is plotted with respect to a vertical current axis, such as the i(t) 310.

The input voltage 406 is shown having an energizing voltage 410, a hold voltage 412, and a disable voltage 414. The energizing voltage 410 can be a large voltage, relative to the voltage ratings of the solenoid 102. The energizing voltage 410 should be large enough to ensure movement of the solenoid 102.

When parameterizing the solenoid system 100, the largest energizing voltage 410 required by a solenoid, in a group of solenoids, can be chosen as the energizing voltage 410. Alternatively, the energizing voltage 410 can be customized for each solenoid 102 individually.

The input voltage 406 and the digital current signal 408 can be initiated by a rising edge of the control signal 402. As the energizing voltage 410 is large, an adjustable ramp 416 can be used to bring the solenoid 102 up from the disable voltage 414 to the energizing voltage 410 without overly stressing the solenoid 102. The adjustable ramp 416 can be created by varying the PWM signal provided by the gate driver 116.

The hold voltage 412 is shown being between the energizing voltage 410 and the disable voltage 414. The hold voltage 412 can be a voltage that holds the plunger 108 of FIG. 1 in position without movement.

When a group of solenoids are being parameterized, the hold voltage 412 can be the lowest voltage where all solenoids 102 in a group are restrained from movement. The hold voltage 412 can also be determined individually for each solenoid 102 as the lowest voltage preventing movement of the solenoid 102.

The first timing diagram 400 depicts the operation of the solenoid system 100. The integrated solenoid driver 104 of FIG. 1 can initiate the adjustable ramp 416 by providing the control signal 402 to the gate driver 116. The gate driver 116 can then provide the adjustable ramp 416 to bring the solenoid 102 from an off voltage 418 of zero volts to the energizing voltage 410.

As the adjustable ramp 416 is applied, the plunger 108 will move within the solenoid 102. In some cases, the plunger 108 can begin to move during the adjustable ramp 416, in other cases, the plunger 108 will move during the energizing voltage 410, and in yet other cases the plunger 108 will move during both the adjustable ramp 416 and the energizing voltage 410. Movement of the plunger 108 will generate a back electromotive force, which can be detected as a drop in current.

As the plunger 108 begins to move within the solenoid 102, the back electromotive forces are generated and the drop in current is detected. The drop in current can be detected by the control logic 130 during the energizing voltage 410 or during the adjustable ramp 416.

The input voltage 406 and the digital current signal 408 can be terminated by a falling edge of the control signal 402. The input voltage 406 can provide a ramp down 420 at the falling edge of the control signal 402 for bringing the input voltage 406 from the hold voltage 412 down to the disable voltage 414.

The input voltage 406 is depicted including both a digital voltage signal 422 and an AC signal 424, which is an AC voltage signal or an AC carrier signal. For ease of description, the AC signal 424 will be described herein as the AC carrier signal 424. The digital voltage signal 422 can be determined by the PWM signal from the PWM ramping module 122 of FIG. 1 while the AC carrier signal 424 can be provided by the AC carrier module 134 of FIG. 1 and superimposed on the PWM duty cycle of the digital voltage signal 422.

As shown, the AC carrier signal 424 is shown superimposed on the energizing voltage 410, the hold voltage 412, and the disable voltage 414. Illustratively for example, the frequency of the AC carrier signal 424 can be around 1 Hz to 1 kHz. As shown, the disable voltage 414 should be at least larger than half of the peak-to-peak voltage of the AC carrier signal 424.

The digital current signal 408 can be analyzed by the AC carrier module 134 to determine both attributes of the digital current signal 408, that is the DC offset current amplitude 426 and the AC current amplitude 428. The solenoid 102 responds to the AC carrier signal 424 with a sinusoidal response signal, which is detected by the AC carrier module 134 as the AC current amplitude 428. The AC current amplitude 428 is the maximum value or peak of the sinusoidal response signal as measured from the DC offset current amplitude 426 to the highest positive value or lowest negative value.

If AC current amplitude 428 is high, the inductance of the solenoid 102 is low and when the AC current amplitude 428 is low, the inductance of the solenoid 102 is high. That is, the AC carrier module 134 can determine the AC current amplitude 428 is a low AC current amplitude based on the plunger 108 being in a retracted position and determine the AC current amplitude 428 is a high AC current amplitude based on the plunger 108 being in an extended position.

The high AC and low AC current amplitude can be determined by an AC amplitude threshold 430 or by comparing the AC current amplitude 428 to a previous value. Based on this determination of high or low values for the AC current amplitude 428, a binary signal indicating proper plunger 108 position can be determined. The AC amplitude threshold 430 can be programmable trigger levels measured against the AC current amplitude 428 through the coil 106 of FIG. 1 and used to determine extended or retracted position of the plunger 108.

In one contemplated embodiment, the control logic 130 can instruct the gate driver 116 to modify the PWM signal to provide the hold voltage 412 or for dropping from the energizing voltage 410 to the hold voltage 412 based on the position of the plunger 108 being detected in the actuated position as determined by the AC current amplitude 428.

As will be appreciated, the hold voltage 412 can significantly reduce the power consumption of the solenoid 102. This is all the more important as the time spent using the hold voltage 412 increases in relation to the energizing voltage 410.

Furthermore, a DC offset current amplitude threshold 432 is shown extending across the digital current signal 408. The DC offset current amplitude threshold 432 can be used to determine a high resistance through the coil 106, which indicates a high temperature and the solenoid 102 should be changed. For example, when the digital current signal 408 or the DC offset current amplitude 426 falls below the DC offset current amplitude threshold 432 during the actuation duration 404, an alarm or a fault can be generated, which indicates that the solenoid 102 should be replaced. The AC amplitude threshold 430 can be a threshold of the AC current amplitude 428 while the DC offset current amplitude threshold 432 can be a lower threshold of the digital current signal 408 or the DC offset current amplitude 426.

Figure 5:
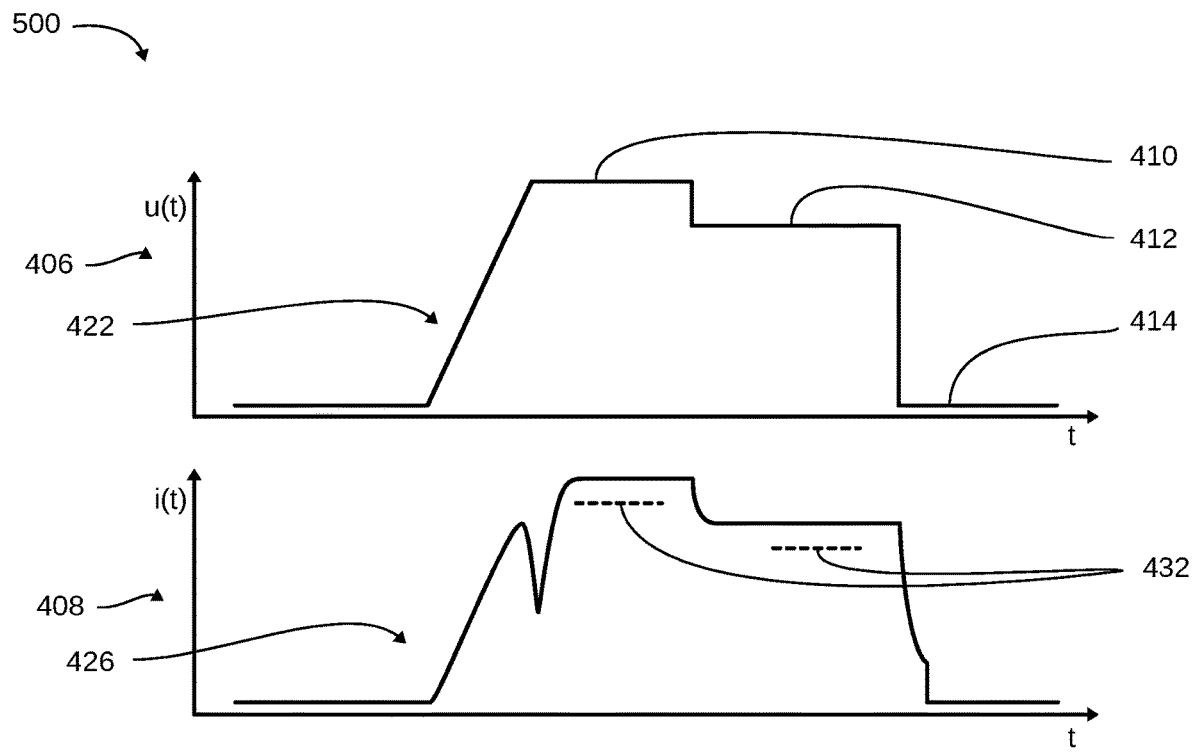
FIG. 5 is a second timing diagram for the solenoid system of FIG. 1.

Referring now to FIG. 5, therein is shown a second timing diagram 500 for the solenoid system 100 of FIG. 1. The second timing diagram can depict the input voltage 406 having only the digital voltage signal 422 and without the AC carrier signal 424 of FIG. 4 applied thereto.

Similarly, the current response of the solenoid 102 of FIG. 1 is shown as the digital current signal 408 having only the DC offset current amplitude 426 and without the AC current amplitude 428 of FIG. 4. It has been discovered that detecting the digital voltage signal 422 and the DC offset current amplitude 426 can allow the resistance of the coil 106 of FIG. 1 to be calculated with minimal additional power or additional components by dividing the digital voltage signal 422 at one specific time by the AC current amplitude 428 detected at the same time. Multiple readings can be taken and averaged to increase signal to noise of the reading.

The temperature of the coil 106, which is proportional to the resistance of the coil 106, can be used to apply the disable voltage 414 or the off voltage 418 of FIG. 4 if the temperature rises above a temperature threshold. Furthermore, the temperature can be used to generate a fault or a temperature reading as an output of the solenoid system 100.

The DC offset current amplitude threshold 432 can be utilized, for example, to detect a low DC offset current amplitude 426 during the energizing voltage 410 or the hold voltage 412. If the DC offset current amplitude 426 drops below the DC offset current amplitude threshold 432, the low DC offset current amplitude 426 would indicate a large resistance and therefore that the solenoid 102 is operating at a high temperature that is not operating with regard to predefined specification requirements.

Notably, when the AC carrier signal 424 is not included as a component of the digital voltage signal 422, the disable voltage 414 can be lower, even zero volts, and is not restricted to being greater than half the peak-to-peak voltage of the AC carrier signal 424 as is the case when the AC carrier signal 424 is included with the digital voltage signal 422.

Figure 6:
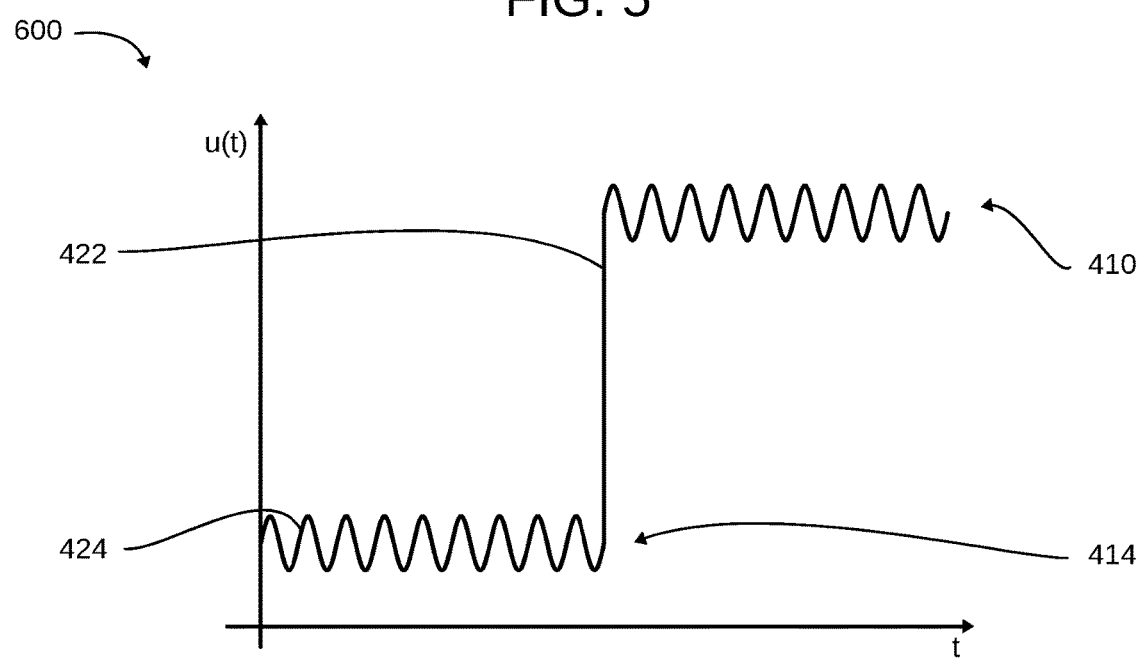
FIG. 6 is a third timing diagram for the solenoid system of FIG. 1.

Referring now to FIG. 6, therein is shown a third timing diagram 600 for the solenoid system 100 of FIG. 1. The third timing diagram 600 depicts the input voltage 406 of FIG. 4 to the coil 106 of the solenoid 102, both of FIG. 1, and which includes the AC carrier signal 424 superimposed onto the digital voltage signal 422.

The digital voltage signal 422 is shown providing both the disable voltage 414 and the energizing voltage 410. The voltage amplitude of the AC carrier signal 424 is half the peak-to-peak value while the period can be one divided by the frequency of the AC carrier signal 424.

Figure 7:
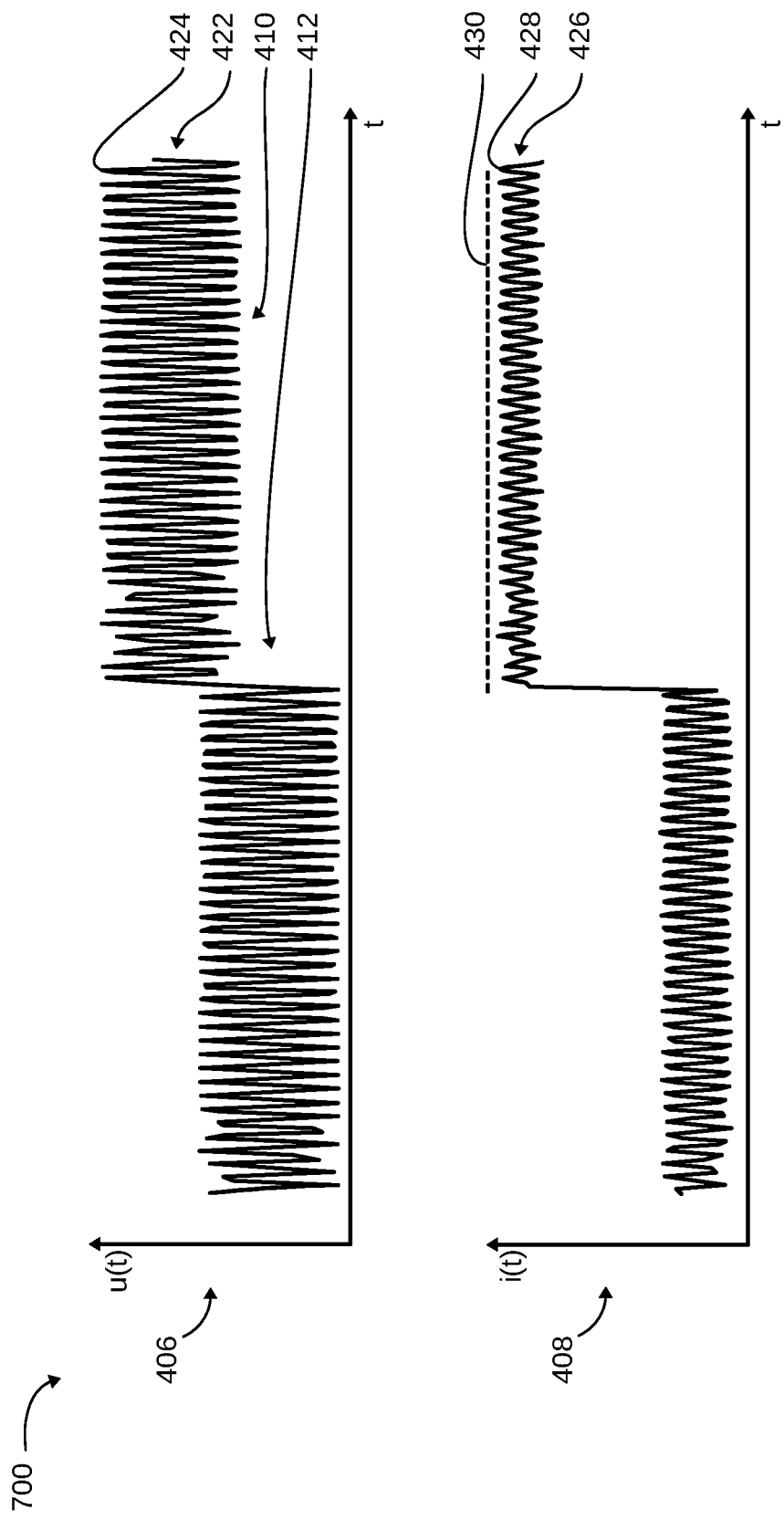
FIG. 7 is a fourth timing diagram for the solenoid system of FIG. 1.

Referring now to FIG. 7, therein is shown a fourth timing diagram 700 for the solenoid system 100 of FIG. 1. The input voltage 406 and the digital current signal 408 are depicted with respect to time along the horizontal axis. The input voltage 406 can include the digital voltage signal 422 having the AC carrier signal 424 superimposed thereon.

The input voltage 406 can begin at the hold voltage 412 and then increase to the energizing voltage 410. As will be appreciated, the digital voltage signal 422 can increase from 6 volts during the hold voltage 412 to 7 volts while in the energizing voltage 410.

The AC carrier signal 424 can oscillate between about 5.5 volts to about 6.5 volts during the hold voltage 412 and can oscillate between about 6.5 volts to about 7.5 volts during the energizing voltage 410. The AC carrier signal 424 can therefore have a voltage amplitude of about 0.5 volts and a frequency of about 1 Hz to about 1 kHz making the period of the AC carrier signal 424 between 1 second per cycle and 1 millisecond per cycle.

The digital current signal 408 is shown having both the DC offset current amplitude 426 and the AC current amplitude 428 response of the solenoid 102 of FIG. 1 to the input voltage 406. Illustratively, for example, the DC offset current amplitude 426 is shown centered at around 370 mA during the response to the hold voltage 412 and around 435 mA during the response to the energizing voltage 410; however, it should be understood that the DC offset current amplitude 426 will depend on the electrical characteristics of the coil 106 of FIG. 1 for the specific solenoid 102 used.

Continuing with the illustrative example, the AC current amplitude 428 can range from about 180 mA to 190 mA during the hold voltage 412 and range from about 215 mA to 220 mA during the energizing voltage 410. It will be appreciated that the AC current amplitude 428 is smaller when the energizing voltage 410 is applied to the solenoid 102 and that the AC current amplitude 428 will depend on the electrical characteristics of the coil 106 for the specific solenoid 102 used.

The present example depicts the AC current amplitude 428 decreasing from a value of about 10 mA during the hold voltage 412 to about 5 mA during the energizing voltage 410. A low AC current amplitude can indicate that the plunger 108 of FIG. 1 has retracted into the solenoid 102. That is, the solenoid 102 is activated in the retracted position based on the energizing voltage 410 being applied and low AC current amplitude resulting.

In one contemplated embodiment, the AC amplitude threshold 430 can be used to determine the low AC current amplitude. That is, if the AC current amplitude 428 is less than the AC amplitude threshold 430 during the energizing voltage 410, a low AC current amplitude can be identified and the position of the plunger 108 as retracted can also be determined.

Alternatively, a high AC current amplitude can be determined if the AC current amplitude 428 is greater than the AC amplitude threshold 430 during the energizing voltage 410. The high AC current amplitude can indicate the position of the plunger 108 in an extended position.

Figure 8:
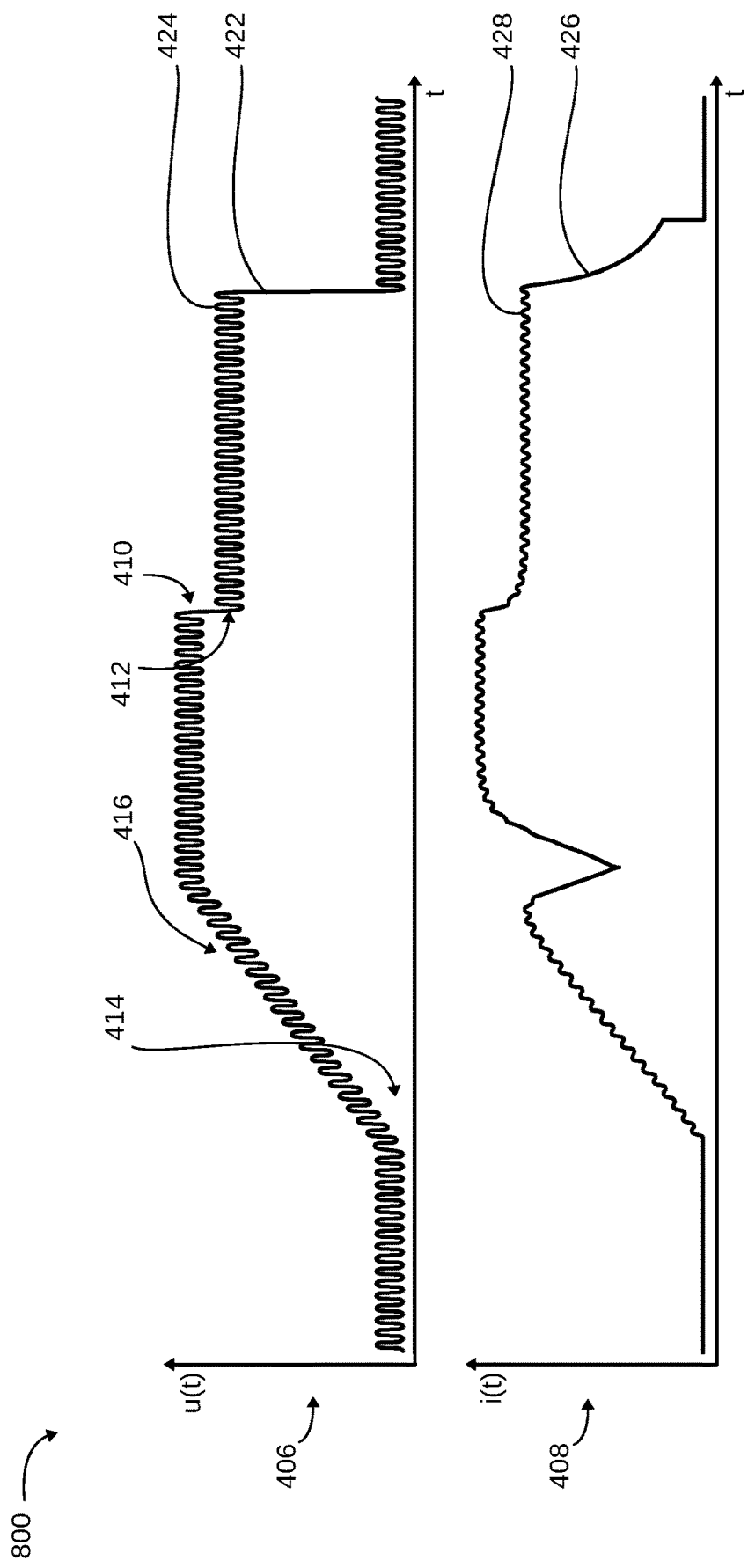
FIG. 8 is a fifth timing diagram for the solenoid system of FIG. 1.

Referring now to FIG. 8, therein is shown a fifth timing diagram 800 for the solenoid system 100 of FIG. 1. The input voltage 406 and the digital current signal 408 are depicted with respect to time along the horizontal axis. The input voltage 406 can include the digital voltage signal 422 having the AC carrier signal 424 superimposed thereon.

The AC carrier signal 424 can be superimposed on the disable voltage 414, which is presently depicted as the off voltage 418 of FIG. 4, the energizing voltage 410, the hold voltage 412, as well as the adjustable ramp 416. The AC carrier signal 424 is shown having a similar amplitude across all regions of the digital voltage signal 422.

The disable voltage 414 can be at zero volts or the off voltage 418. The AC current amplitude 428 response during the disable voltage 414 is shown to be zero. When the AC current amplitude 428 is required to be detected during the disable voltage 414, the disable voltage 414 should be at least greater than the voltage amplitude of the AC carrier signal 424. As depicted, the AC current amplitude 428 is detected on the DC offset current amplitude 426 in areas that correspond in time to the adjustable ramp 416, the energizing voltage 410, and the hold voltage 412.

In the present example, the digital voltage signal 422 is zero volts at the disable voltage 414, ramps to 10 volts at the energizing voltage 410, falls to 8 volts at the hold voltage 412, and falls back to 0 volts at the disable voltage 414. The AC carrier signal 424 can have an amplitude of about one volt when applied to each of the disable voltage 414, the energizing voltage 410, the hold voltage 412, and the adjustable ramp 416.

The DC offset current amplitude 426 is shown at 0 mA when the disable voltage 414 is applied to the coil 106 of the solenoid 102, both of FIG. 1, and can ramp up to 550 mA during the adjustable ramp 416. A dip in current is the result of back electromotive forces, or the result of the plunger 108 of FIG. 1 moving within the coil 106. The AC current amplitude 428 can be approximately 10 mA when the energizing voltage 410 is applied and can fall to a little less during the hold voltage 412. It will be understood that the digital voltage signal 422, the AC carrier signal 424, the AC current amplitude 428, and the DC offset current amplitude 426 will depend on the electrical characteristics of the coil 106 within the specific solenoid 102 used.

Figure 9:
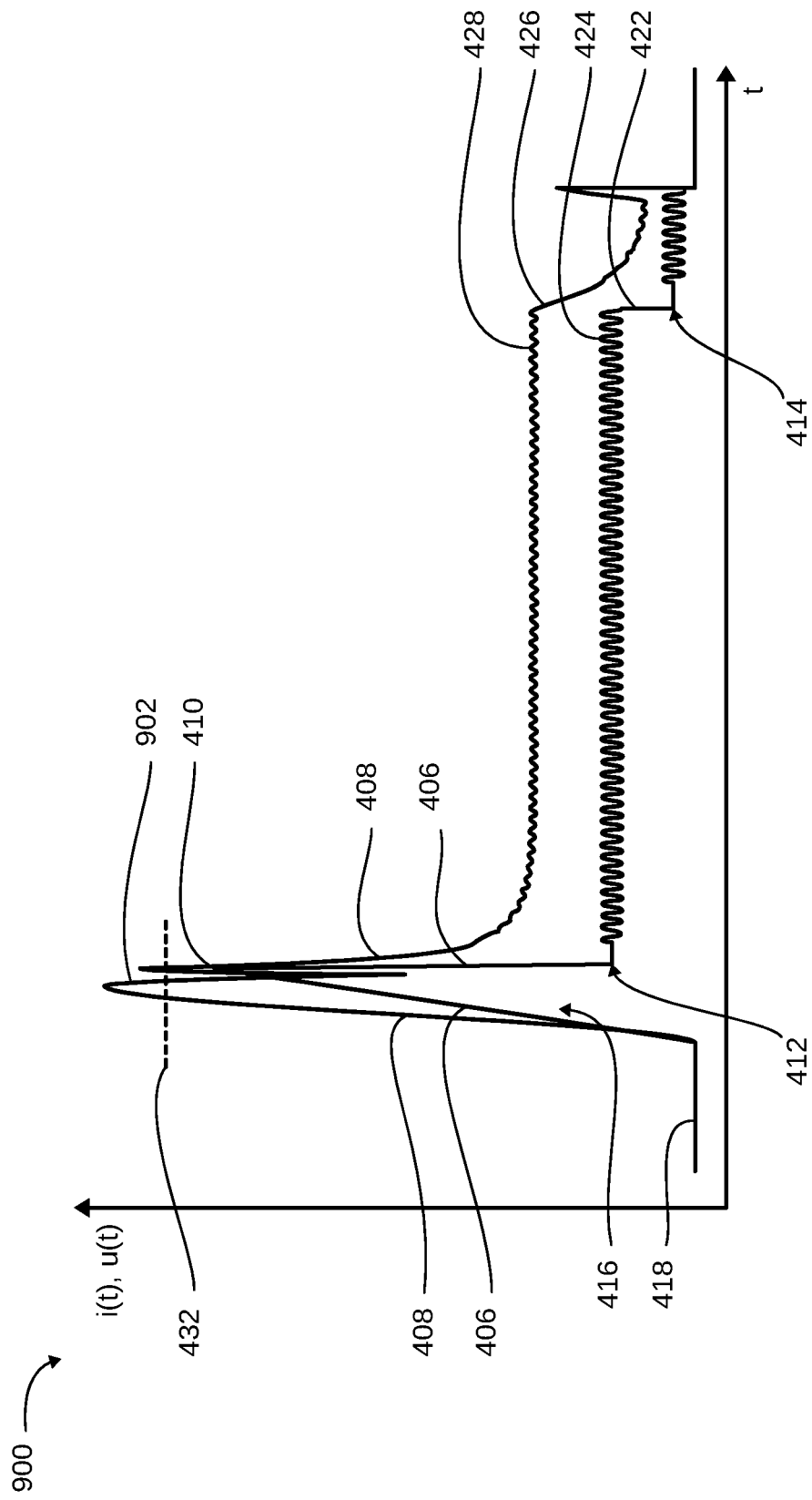
FIG. 9 is a sixth timing diagram for the solenoid system of FIG. 1.

Referring now to FIG. 9, therein is shown a sixth timing diagram 900 for the solenoid system 100 of FIG. 1. The input voltage 406 and the digital current signal 408 are shown together with respect to time on the horizontal axis.

The input voltage 406 is shown at the off voltage 418 prior to applying the adjustable ramp 416 until the energizing voltage 410 is reached, then dropping from the energizing voltage 410 to the hold voltage 412. Lastly, the input voltage 406 is shown dropping to the disable voltage 414 prior to again being placed in the off voltage 418.

The digital current signal 408 is shown having a DC current dip 902 caused by a back electromotive force from the plunger 108 of FIG. 1 moving within the coil 106 of FIG. 1. The DC current dip 902 can be determined by the digital current signal 408 rising above the DC offset current amplitude threshold 432 and falling below the DC offset current amplitude threshold 432 during the adjustable ramp 416 or the energizing voltage 410.

Once the DC current dip 902 is detected, the plunger 108 has moved and the hold voltage 412 can be applied to the coil 106 of the solenoid 102 of FIG. 1. The AC carrier signal 424 is shown applied to the digital voltage signal 422 during the hold voltage 412. Similarly, the AC current amplitude 428 is shown riding on the DC offset current amplitude 426 during the hold voltage 412.

The AC current amplitude 428 can be used to determine the position of the plunger 108 within the solenoid 102 in order to ensure proper placement and actuation of the plunger 108. The disable voltage 414 can be greater than the amplitude of the AC carrier signal 424 so as to ensure the AC carrier signal 424 is propagated through the coil 106 during the disable voltage 414. A current spike in the DC offset current amplitude 426 can indicate a second movement of the plunger 108 back to the rest position.

Figure 10:
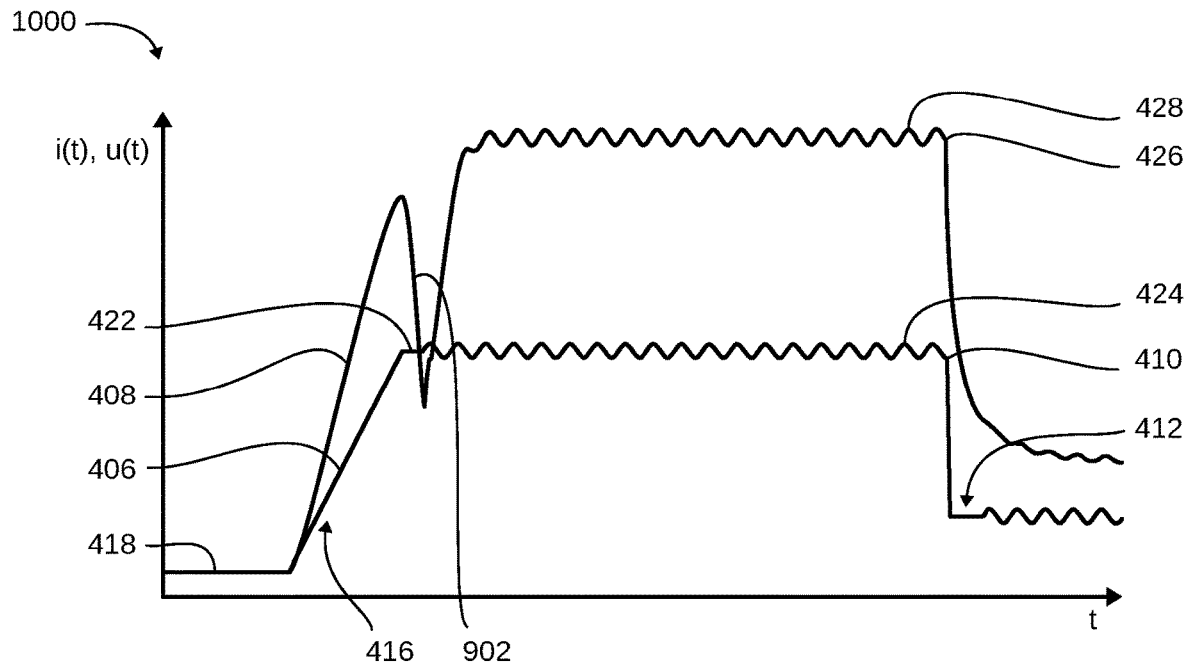
FIG. 10 is a seventh timing diagram for the solenoid system of FIG. 1.

Referring now to FIG. 10, therein is shown a seventh timing diagram 1000 for the solenoid system 100 of FIG. 1. The input voltage 406 and the digital current signal 408 are shown together with respect to time on the horizontal axis.

The input voltage 406 is shown at the off voltage 418 prior to applying the adjustable ramp 416 until the energizing voltage 410 is reached. The input voltage 406 is then dropped from the energizing voltage 410 to the hold voltage 412.

The digital current signal 408 is shown having the DC current dip 902 caused by a back electromotive force from the plunger 108 of FIG. 1 moving within the coil 106 of FIG. 1. The DC current dip 902 can be determined by the digital current signal 408 rising above the DC offset current amplitude threshold 432 of FIG. 4 and falling below the DC offset current amplitude threshold 432 during the adjustable ramp 416 or the energizing voltage 410.

The AC carrier signal 424 is shown applied to the digital voltage signal 422 during energizing voltage 410 and the hold voltage 412. Similarly, the AC current amplitude 428 is shown riding on the DC offset current amplitude 426 during the energizing voltage 410 and the hold voltage 412. The AC current amplitude 428 can be used to determine the position of the plunger 108 within the solenoid 102 in order to ensure proper placement and actuation of the plunger 108.

Figure 11:
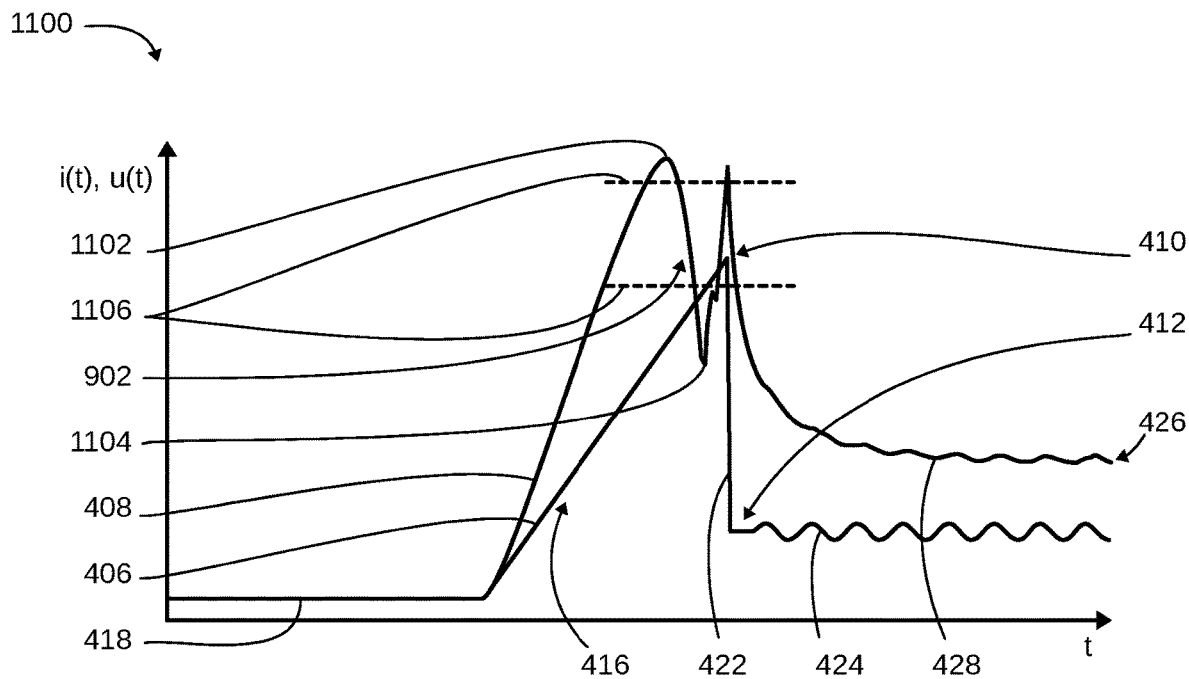
FIG. 11 is an eighth timing diagram for the solenoid system of FIG. 1.

Referring now to FIG. 11, therein is shown an eighth timing diagram 1100 for the solenoid system 100 of FIG. 1. The input voltage 406 and the digital current signal 408 are shown together with respect to time on the horizontal axis.

The input voltage 406 is shown at the off voltage 418 prior to applying the adjustable ramp 416 until the energizing voltage 410 is reached, then dropping from the energizing voltage 410 to the hold voltage 412.

The digital current signal 408 is shown having the DC current dip 902 caused by a back electromotive force from the plunger 108 of FIG. 1 moving within the coil 106 of FIG. 1. The DC current dip 902 can be determined by determining a local high voltage 1102 and a local low voltage 1104 of the digital current signal 408 being larger than a back electromotive force threshold 1106. Alternatively, the DC current dip 902 can be detected as the digital current signal 408 rising above the DC offset current amplitude threshold 432 of FIG. 4 and falling below the DC offset current amplitude threshold 432 during the adjustable ramp 416 or the energizing voltage 410.

Once the DC current dip 902 is detected, the plunger 108 has moved and the hold voltage 412 can be applied to the coil 106 of the solenoid 102 of FIG. 1. The AC carrier signal 424 is shown applied to the digital voltage signal 422 during the hold voltage 412. Similarly, the AC current amplitude 428 is shown riding on the DC offset current amplitude 426 during the hold voltage 412. The AC current amplitude 428 can be used to determine the position of the plunger 108 within the solenoid 102 in order to ensure proper placement and actuation of the plunger 108.

Figure 12:
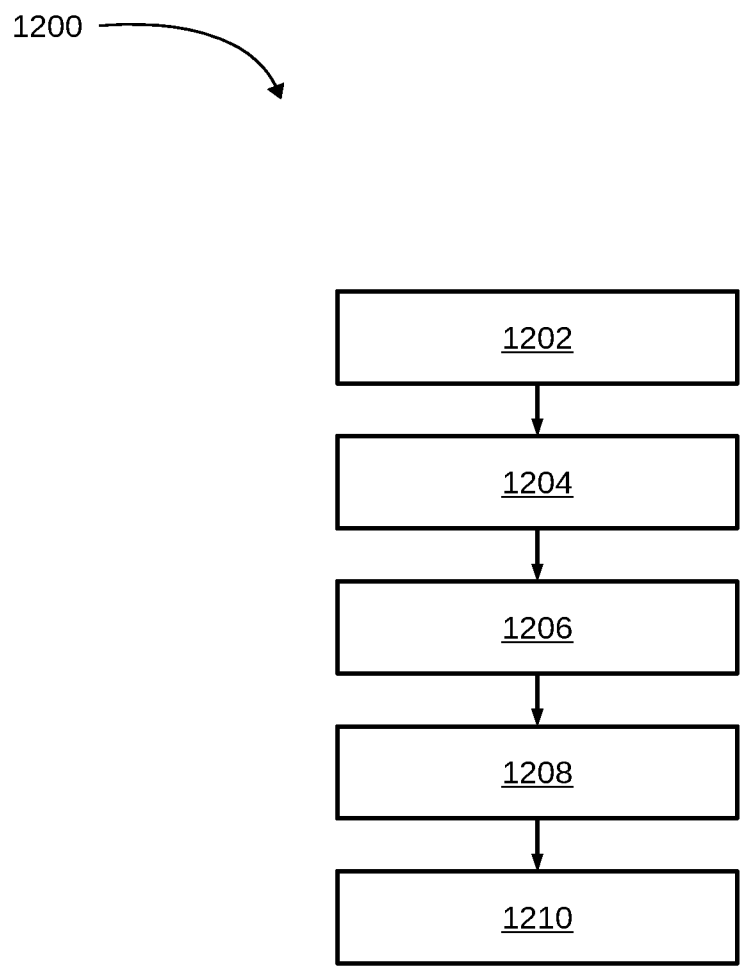
FIG. 12 is a control flow for the solenoid system.

Referring now to FIG. 12, therein is shown a control flow 1200 of a method for operating the solenoid system 100. The method can include providing an energizing voltage to a coil of a solenoid with a switch controller coupled thereto in a block 1202; providing an AC signal with a control logic coupled to the switch controller, the AC signal being superimposed onto the energizing voltage in a block 1204; detecting current through the coil with a current sensor coupled thereto, the current through the coil including an AC current amplitude induced by the AC signal and including a DC offset current amplitude in a block 1206; determining the AC current amplitude is a low AC current amplitude based on an armature within the solenoid being in a retracted position or determining the AC current amplitude is a high AC current amplitude based on the armature being in an extended position with the control logic, and where the AC current amplitude is determined utilizing the AC signal for synchronous demodulation in a block 1208; and determining a temperature fault based on the DC offset current amplitude falling below a DC offset current amplitude threshold in a block 1210.

Thus, it has been discovered that the solenoid system furnishes important and heretofore unknown and unavailable solutions, capabilities, and functional aspects. The resulting configurations are straightforward, cost-effective, uncomplicated, highly versatile, accurate, sensitive, and effective, and can be implemented by adapting known components for ready, efficient, and economical manufacturing, application, and utilization.

Illustratively, for example the AC carrier signal 424 superimposed onto the energizing voltage 410, the hold voltage 412, and the digital voltage signal 422 can be used to sense the current through the coil 106 of the solenoid 102 including the AC current amplitude 428 and the DC offset current amplitude 426 which provides systems and methods of precise control and monitoring of the solenoid 102 that provides a full solution for lower power, low cost, and highly integrated internal position and temperature measurements, a solution not previously available in the electronic solenoid industry.

This solution unexpectedly provides a very low power solution allowing synchronous demodulation of the sense input. Furthermore, the DC offset current amplitude 426 and the AC current amplitude 428 can be calculated using multiple readings and averaging the results which provides an unexpectedly large signal to noise ratio allowing even smaller AC carrier signal 424 amplitudes to be used and greatly reducing power consumption.

Yet still further, in addition to measuring the inductance, the AC carrier signal 424 can be used as a dithering signal to overcome breakaway torques due to static friction. This can be useful for valves, but also for DC motors with brushes for smooth starting at low speeds.

Thus, the solenoid system 100 provides systems and methods of precise control and monitoring of the solenoid 102 that provides a full solution for lower power, low cost, and integrated internal position measurements. The solenoid system 100 further provides systems and methods of precise control and monitoring of the solenoid 102 temperature measurements in that the DC offset current amplitude 426 can be precisely calculated and used to divide the input voltage 406 in determining the resistance of the coil 106 and thereby the temperature of the coil 106.

While the solenoid system has been described in conjunction with a specific best mode, it is to be understood that many alternatives, modifications, and variations will be apparent to those skilled in the art in light of the preceding description. Accordingly, it is intended to embrace all such alternatives, modifications, and variations, which fall within the scope of the included claims. All matters set forth herein or shown in the accompanying drawings are to be interpreted in an illustrative and non-limiting sense.

Figure 13:
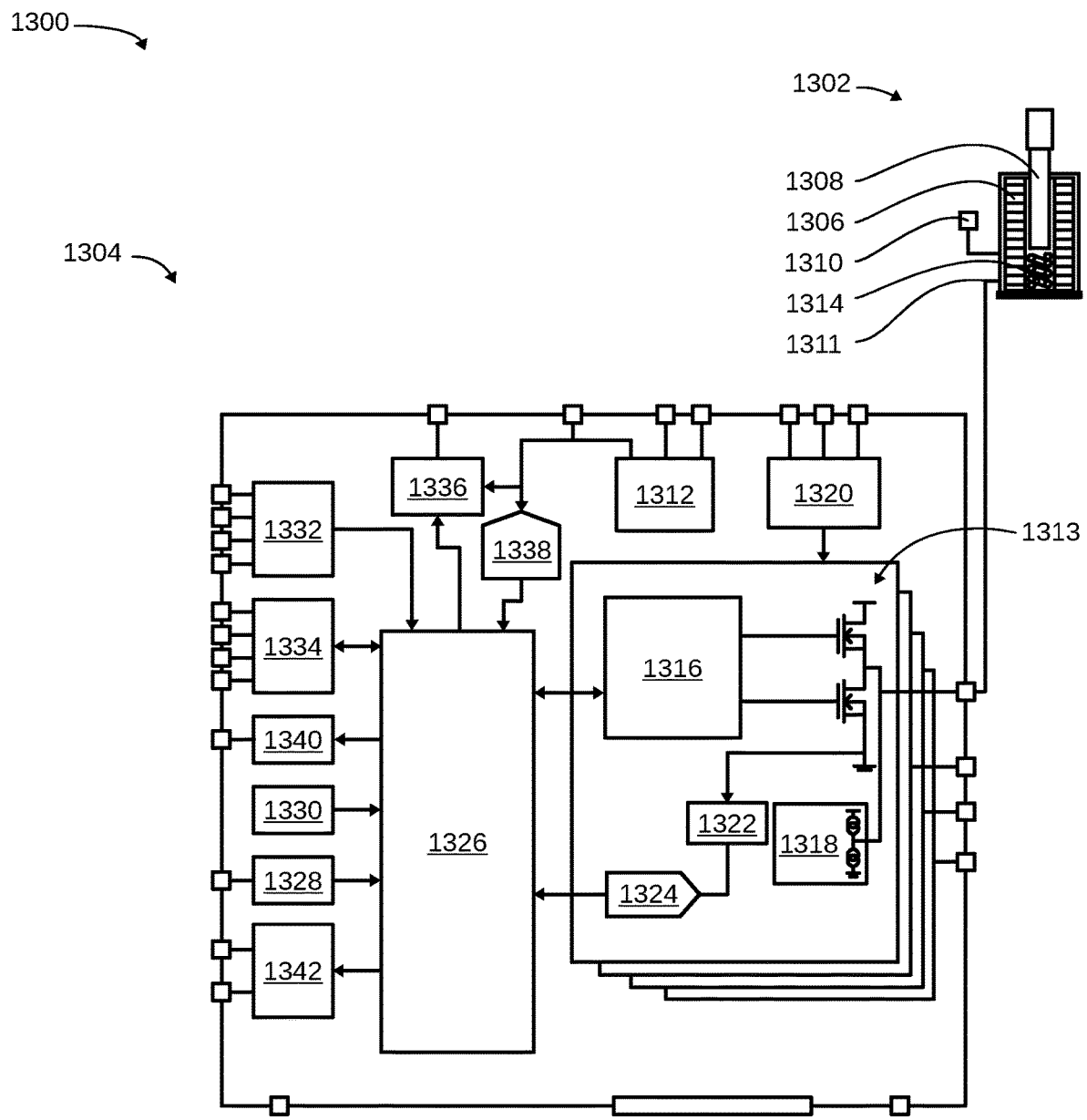
FIG. 13 is a block diagram of the solenoid system in a low power embodiment.

Referring now to FIG. 13, therein is shown a block diagram of the solenoid system 1300 in a low power embodiment. The low power embodiment relates to electric solenoids, more particularly to electric solenoids implementing a motion triggered low power mode.

It is contemplated that the low power embodiment could be implemented with the position and temperature detection embodiment of FIG. 1 or could be implemented independently. As an extension of the electronics industry, electronic solenoids have come under ever-increasing commercial competitive pressures demanding miniaturized, feature rich, low cost, and low power solenoids.

Chief among current technical problems constraining electric solenoids is high electric power consumption. This technical problem hinders remote installations, miniaturized applications, battery power applications, and greatly increases the operating costs across the board.

Of the many design requirements, power consumption has become a primary concern for next generation electric solenoids as many future electronic systems are designed to rely on battery power alone; or when designs are not reliant on battery power, consumers are demanding lower power systems for operational cost savings. High power consumption presents follow on technical problems in that solenoids operating under high power regimes will have greater wear limiting operational lifespan and increasing risk of malfunction.

The technical problem of high power usage arises due to the criticality of electronic solenoids functioning every time. Because of this criticality, a large initial energizing voltage is used to ensure and initiate solenoid movement. However, this large initial energizing voltage is a significant source of power usage.

Furthermore, these large energizing voltages used by prior solutions are also used to maintain the electronic solenoid in position while in use. These large maintenance voltages also contribute to a significant source of power usage of prior solutions.

Some prior solutions focused on detecting solenoid plunger motion in order to determine health of a solenoid and enable faulty solenoids to be replaced without requiring even higher drive voltages. However, these previous attempts continue to rely on high power operation and have failed to provide a technical solution for lowering power consumption, a solution that the industry demands.

In view of the ever-increasing commercial competitive pressures, along with growing consumer expectations and the diminishing opportunities for meaningful product differentiation in the marketplace, it is critical that answers be found for these problems. Thus, a need remains for electronic solenoid systems with significantly lower power consumption. Solutions to these technical problems have been long sought but prior developments have not taught or suggested any technical solutions and, thus, solutions to these problems have long eluded those skilled in the art.

The solenoid system 1300 is depicted having a solenoid 1302 coupled to an integrated solenoid driver 1304.

The solenoid 1302 can be an electromechanical component comprising a coil 1306 with an armature 1308 that moves or otherwise imparts mechanical force in response to a magnetic field generated by passing current through the coil 1306. One skilled in the art will appreciate that other words may be used to describe the armature 1308 including but not limited to a piston, an actuator, a movable core, a movable slug, and a plunger. For descriptive clarity, hereinafter the armature 1308 will be referred to as plunger 1308.

When the coil 1306 is energized by applying a voltage across the solenoid 1302, the plunger 1308 is either extended out of the coil 1306 or retracted into the coil 1306 depending on current direction and system assembly. The solenoid 1302 is shown having a first connection 1310 and a second connection 1311. The first connection 1310 can be coupled to VM, which can be a motor drive voltage larger than supply voltage Vdd 1312, while the second connection 1311 can be coupled to a half bridge 1313 contained within the integrated solenoid driver 1304.

Although the first connection 1310 of the solenoid 1302 is described as connected to VM, it is contemplated that the first connection 1310 could alternatively be connected to ground when other half bridge configurations are used. Still further, it is contemplated that the first connection 1310 could alternatively be connected to a second half bridge to form a full H-bridge for the coil 1306.

The solenoid 1302 can further include a spring 1314 for providing mechanical resistance against the motion of the plunger 1308 and to limit the retraction of the plunger 1308 within the solenoid 1302 during excitation. Both extension and retraction types of solenoids are contemplated and can be adapted. These types of solenoids differ in the location of the spring 1314 and design of the plunger 1308. Rotary solenoids are yet a further contemplated implementation, again differing in the location and design of the spring 1314 and also in the type of movement produced.

The integrated solenoid driver 1304 can include a switch controller 1316 coupled to the solenoid 1302 through a half bridge 1313. The switch controller 1316 is to be understood herein as a physical structural component at least having structural low power inputs and higher power outputs. Isolation for protecting delicate control circuitry is also a common structural component of switch controllers 1316. The switch controller 1316 is typically referred to as a gate driver and for ease of description, the switch controller 1316 will be referred to hereinafter as gate driver 1316.

Illustratively for example, the gate driver 1316 is depicted as a high-side low-side PWM driver. The gate driver 1316 can control the half bridge 1313 with a pulse-width modulated (PWM) signal. The gate driver 1316 can be implemented as dedicated ICs, discrete transistors, or transformers. The gate driver 1316 can also be integrated within a larger IC or IC package.

The half bridge 1313 is depicted having a high side N-Channel Depletion MOSFET and a low side N-Channel Depletion MOSFET. It is alternatively contemplated that the half bridge 1313 could also be implemented using insulated-gate bipolar transistors (IGBTs) or one low side N-Channel Depletion MOSFET and one high side P-Channel Depletion MOSFET, for example. The solenoid 1302 can be coupled to the source of the high side MOSFET and coupled to the drain of the low side MOSFET.

The N-Channel Depletion MOSFET is a depletion-mode MOSFET device which can be doped so that a channel exists with zero volts between the gate and the source. To control the channel, a negative voltage is applied to the gate, which functions as a normally closed switch. The half bridge 1313 and the solenoid 1302 can further be coupled to an open load 1318.

The gate driver 1316 can provide the PWM signal to the half bridge 1313. The PWM signal can provide a duty cycle proportional to an energizing voltage 1506, a hold voltage 1508, and a disable voltage 1510, all of FIG. 15, below, to the coil 1306. The gate driver 1316 can also provide an adjustable ramp 1512 of FIG. 15 from the disable voltage 1510 to the energizing voltage 1506 to the coil 1306 by varying the PWM signal.

The drain of the high side N-Channel Depletion MOSFET can be coupled to VM in order to drive the high side N-Channel Depletion MOSFET positive with respect to the supply voltage Vdd 1312. A charge pump 1320 can optionally drive the high side of the half bridge 1313.

The integrated solenoid driver 1304 can further include a current sensor 1322 coupled to the solenoid 1302. The current sensor 1322 can detect current through the coil 1306 of the solenoid 1302 as an analog current signal.

The current sensor 1322 is to be understood herein as a physical structural component at least having structural input and output connections. However, many forms of the current sensor 1322 are contemplated including Hall effect linear sensors, galvanically isolated sensors, or GMR-based sensors. Yet other forms are contemplated including fluxgate sensors, shunt resistors, and even fiber optic interferometer based sensors.

Figure 15:
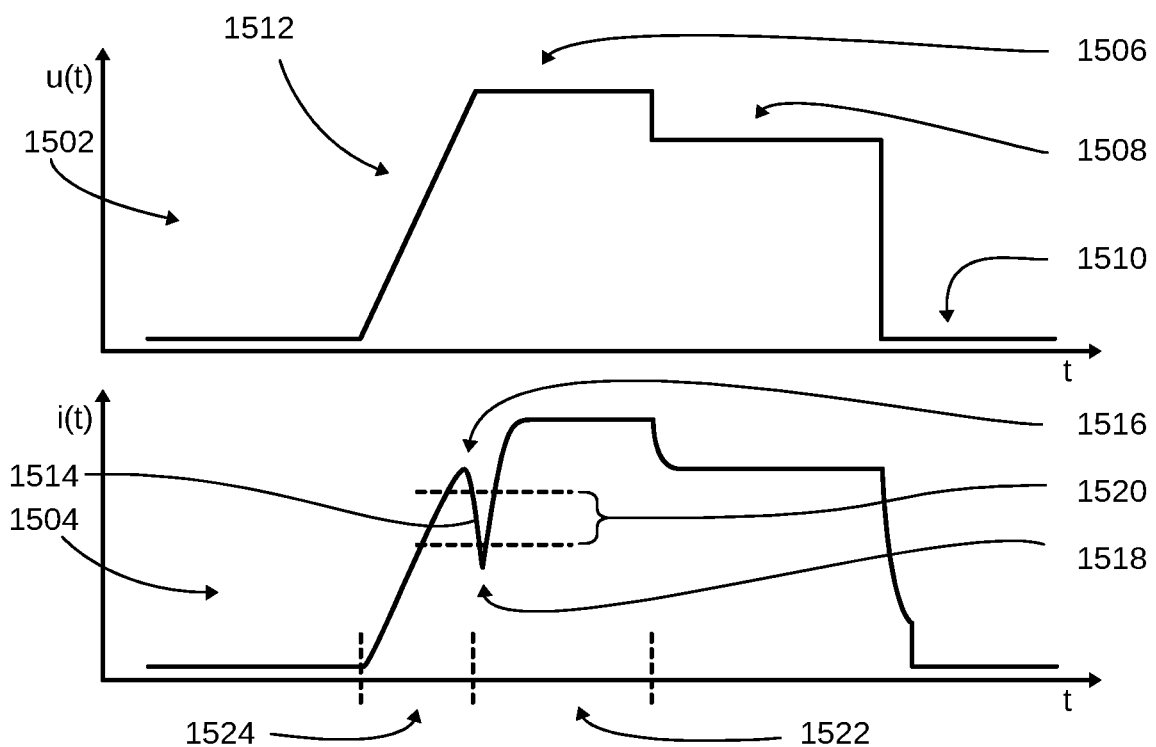
FIG. 15 is a first timing diagram for the solenoid system of FIG. 13.

The integrated solenoid driver 1304 can further include an analog-to-digital converter 1324 for converting the analog current signal to a digital current signal 1504 of FIG. 15, prior to distributing the digital current signal 1504 to control logic 1326. The control logic 1326 can be a digital computational block for performing Voltage Divider Rule (VDR) and Current Divider Rule (CDR) based calculations.

The half bridge 1313, the gate driver 1316, the open load 1318, the current sensor 1322, and the analog-to-digital converter 1324 can be reproduced for multiple solenoids 1302. As shown, the half bridge 1313, the gate driver 1316, the open load 1318, the current sensor 1322, and the analog-to-digital converter 1324 are reproduced for coupling to four solenoids 1302.

The control logic 1326 is to be understood herein as a physical structural component at least having transistor logic gates for providing computation and control. Furthermore, the control logic 1326 includes structural inputs and outputs typically operating between zero and five volts. It is contemplated that the control logic 1326 can be a TTL or CMOS based architecture but could also include other logic families including RTL, DTL, and ECL, for example.

The control logic 1326 can be coupled to the current sensor 1322 through the analog-to-digital converter 1324. The control logic 1326 can compare the digital current signal 1504 with a reference current 1328 to provide a highly accurate current reading.

The control logic 1326 can detect the drop in current 1514 of FIG. 15. The drop in current 1514 is generated by movement of the plunger 1308. More particularly, movement of the plunger 1308 within the solenoid 1302 produces a back electromotive force which is detected as the drop in current 1514 during the energizing voltage 1506, or during the ramp 1512 to the energizing voltage 1506.

The drop in current 1514 indicates movement of the plunger 1308 and can be detected during the energizing voltage 1506, or during the ramp 1512 to the energizing voltage 1506. The control logic 1326 can be coupled to and control the gate driver 1316 with a control signal indicating a voltage level.

The control logic 1326 can compare the drop in current 1514 with a current drop threshold 1520 of FIG. 15. When the drop in current 1514 does not exceed the current drop threshold 1520, the control logic 1326 can provide an error indicating improper movement or no movement of the plunger 1308.

When the control logic 1326 detects the drop in current 1514, the control logic 1326 can direct the gate driver 1316 to provide the hold voltage 1508 to the coil 1306. Furthermore, the control logic 1326 can delay the hold voltage 1508 until a wait time has elapsed.

The wait time can be a programmable variable and can be measured with an oscillator 1330, which can provide a clock pulse. The control logic 1326 can further direct the gate driver 1316 to provide the disable voltage 1510 to the coil 1306 in order to place the solenoid 1302 in a non-actuated state where the position of the plunger 1308 is based on the force of the spring 1314 rather than based on voltages provided by the gate driver 1316.

The gate driver 1316 providing the hold voltage 1508 to the coil 1306 of the solenoid 1302 based on the control logic detecting the drop in the current reflects an unexpected improvement in the functioning of solenoid systems by reducing power and wear during use while still allowing the solenoid 1302 to remain in an actuated state, a combination previously unknown, unexpected, and untested. As such the solution is necessarily rooted in electronics technology in order to overcome a problem, of high power usage specifically arising in the realm of electronic solenoids, by technical means.

The drop in current 1514 detected and measured within the control logic 1326 by way of the current sensor 1322 and the analog-to-digital converter 1324 is used to control the technical process and the internal functioning of the control logic 1326 itself together with its interfaces including the gate driver 1316 and the solenoid 1302. Thus, the drop in current 1514 and subsequent application of the hold voltage 1508 controls the operation of the solenoid system 1300 and inherently comprises and reflects, corresponding technical features of the control logic 1326, the current sensor 1322, the analog-to-digital converter 1324, and the gate driver 1316.

The drop in current 1514 provides a robust indication of plunger 1308 movement and reducing voltage to coil 1306 of the solenoid 1302, from the energizing voltage 1506 to the hold voltage 1508 based on this drop in current 1514, greatly reduces power consumption of the solenoid to the point where the solenoid 1302 could be implemented in remote battery powered systems, such as door locks with extremely low power requirements. In this way power saving is optimized as energizing voltage apply time is minimized.

The information of successful movement can be displayed to a user as can the duration between the initial voltage applied to the coil 1306 of the solenoid 1302 to the drop in current 1514. The integrated solenoid driver 1304 is further shown including input output modules for providing the movement and duration information.

Illustratively, the input output modules can include a control interface 1332 having multiple control pins. The input output modules can also include a serial peripheral interface 1334 for providing movement and duration information.

Another example of the input output modules can include a voltage input and output 1336 having a linear voltage regulator and coupled to the control logic 1326 with an enable control line. The control logic 1326 can also be coupled to and monitor the supply voltage Vdd 1312 through an analog-to-digital converter 1338.

The control logic 1326 can detect faults in the supply voltage Vdd 1312 including under voltage lockout faults and over voltage threshold faults. The control logic 1326 can also detect over current faults as well as faults based on an i(t) 1410 of FIG. 14 not having a drop large enough to satisfy the current drop threshold 1520 of FIG. 15 or based on the i(t) 1410 not rising above and falling below the current drop threshold 1620 of FIG. 16, both of which would indicate improper plunger 1308 movement.

These faults can be output with a fault interface 1340 coupled to the control logic 1326. As yet another example of the input output modules, the control logic could be coupled to a multiplexed interface 1342 having multiplexed input and output pins.

Figure 14:
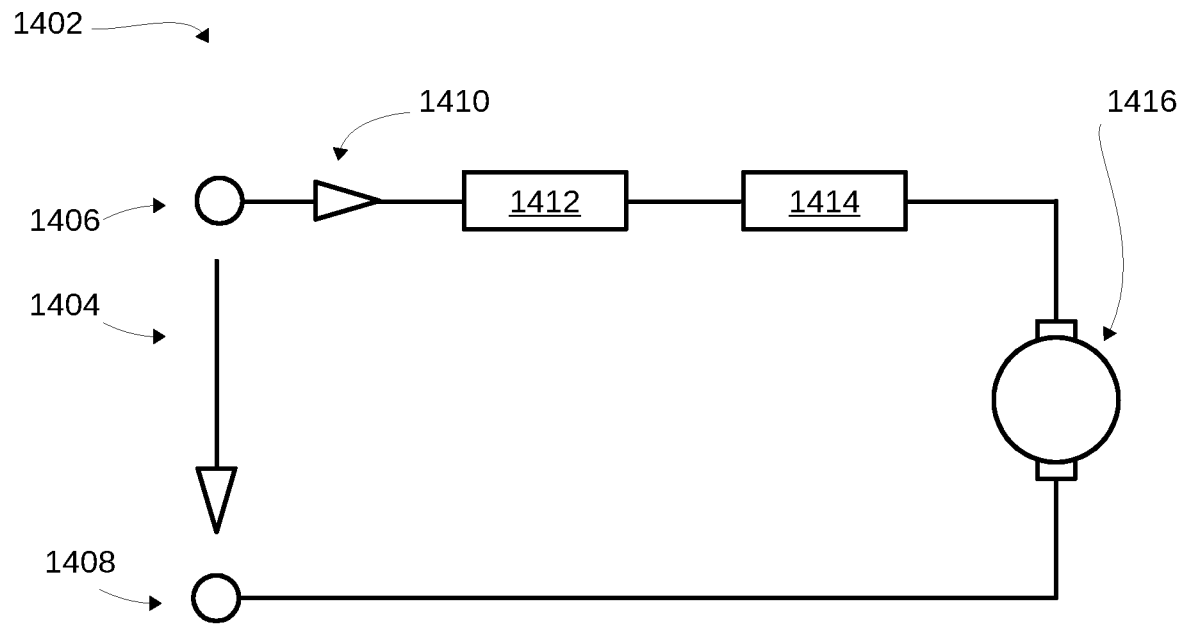
FIG. 14 is a block diagram for an equivalent circuit of the solenoid system of FIG. 13.

Referring now to FIG. 14, therein is shown a block diagram for an equivalent circuit 1402 of the solenoid system 1300 of FIG. 13. The equivalent circuit 1402 can provide a representation of the solenoid 1302 of FIG. 13 coupled to the integrated solenoid driver 1304 of FIG. 13 and retains the electrical characteristics thereof. The equivalent circuit 1402 enables resistances and inductances to be simplified for analysis.

The equivalent circuit 1402 can provide a voltage represented as a step function, u(t) 1404, across an input terminal 1406 and an output terminal 1408. The u(t) 1404 can represent the PWM controlled signal provided by the gate driver 1316 of FIG. 13 from the output of the half bridge 1313 of FIG. 13 to the coil 1306 of FIG. 13. The equivalent circuit 1402 is also shown including a current i(t) 1410 through an equivalent resistor 1412, an equivalent inductor 1414 and an equivalent solenoid 1416. The i(t) 1410 can be the current through the coil 1306 as detected by the current sensor 1322 of FIG. 13.

The u(t) 1404 can be equal to the voltage drop across the equivalent resistor 1412 plus the voltage drop across the equivalent inductor 1414 plus the back emf produced by the equivalent solenoid 1416 in motion. The BEMF voltage can be represented and calculated by a constant (Kemf) times the flux and speed of the equivalent solenoid 1416.

Referring now to FIG. 15, therein is shown a first timing diagram for the solenoid system 1300 of FIG. 13. The first timing diagram depicts a digital voltage signal 1502 and a digital current signal 1504. The digital voltage signal 1502 can be the signal of voltage or u(t) 1404 of FIG. 14 from the output of the half bridge 1313 of FIG. 13 to the coil 1306 of FIG. 13. The digital current signal 1504 can be the signal of current or i(t) 1410 of FIG. 14 through the solenoid 1302 of FIG. 13 as detected by the current sensor 1322 of FIG. 13.

The digital voltage signal 1502 and the digital current signal 1504 are plotted with respect to a horizontal time axis. The digital voltage signal 1502 is plotted with respect to a vertical voltage axis, such as the u(t) 1404. The digital current signal 1504 is plotted with respect to a vertical current axis, such as the i(t) 1410.

The digital voltage signal 1502 is shown having an energizing voltage 1506, a hold voltage 1508, and a disable voltage 1510. The energizing voltage 1506 can be a large voltage, relative to the voltage ratings of the solenoid 1302. The energizing voltage 1506 should be large enough to ensure movement of the solenoid 1302.

When parameterizing the solenoid system 1300, the largest energizing voltage 1506 required by a solenoid, in a group of solenoids, can be chosen as the energizing voltage 1506. Alternatively, the energizing voltage 1506 can be customized for each solenoid 1302 individually.

As the energizing voltage 1506 is large, an adjustable voltage ramp, such as the adjustable ramp 1512, can be used to bring the solenoid 1302 up from the disable voltage 1510 to the energizing voltage 1506 without overly stressing the solenoid 1302. The adjustable ramp 1512 can be created by varying the PWM signal provided by the gate driver 1316 of FIG. 13.

The hold voltage 1508 is shown being between the energizing voltage 1506 and the disable voltage 1510. The hold voltage 1508 can be a voltage that holds the plunger 1308 of FIG. 13 in position without movement.

When a group of solenoids are being parameterized, the hold voltage 1508 can be the lowest voltage where all solenoids 1302 in a group are restrained from movement. The hold voltage 1508 can also be determined individually for each solenoid 1302 as the lowest voltage preventing movement of the solenoid 1302.

The first timing diagram depicts the operation of the solenoid system 1300. Starting with the disable voltage 1510, which is usually 0 volts, the integrated solenoid driver 1304 of FIG. 13 can initiate the adjustable ramp 1512 to bring the voltage to the coil 1306 of the solenoid 1302 from the disable voltage 1510 to the energizing voltage 1506.

As the adjustable ramp 1512 is applied and the energizing voltage 1506 is reached, the plunger 1308 will move within the solenoid 1302. In some cases, the plunger 1308 can begin to move during the adjustable ramp 1512, in other cases, the plunger 1308 will move during the energizing voltage 1506. Movement of the plunger 1308 will generate a back electromotive force, which can be detected as a drop in current 1514.

As the plunger 1308 begins to move within the solenoid 1302, the back electromotive forces are generated and the drop in current 1514 is detected. The drop in current 1514 can be detected by the control logic 1326 of FIG. 13 during the energizing voltage 1506 and during the adjustable ramp 1512.

The drop in current 1514 can be measured between a local current maximum 1516 and a local current minimum 1518, both detected by the control logic 1326. The control logic 1326 can measure the drop in current 1514 against a current drop threshold 1520, which can be an absolute value of the change in current.

If the drop in current 1514 is larger than the current drop threshold 1520, motion of the plunger 1308 is recognized and the integrated solenoid driver 1304 can then reduce the u(t) 1404 from the energizing voltage 1506 to the hold voltage 1508. Although the current drop threshold 1520 is depicted as an amount of the i(t) 1410 change required to detect the drop in current 1514, it is alternatively contemplated that the current drop threshold 1520 could also be a single current value and the drop in current 1514 could be determined by first detecting the i(t) 1410 rising above the current drop threshold 1520 and then the i(t) 1410 falling below the current drop threshold 1520 due to the back electromotive force of the plunger 1308.

In the present embodiment, the hold voltage 1508 is applied after a wait time 1522 had elapsed. The wait time 1522 can allow slower or sticky solenoids to complete their motion before the power saving hold voltage 1508 is applied.

As will be appreciated, the hold voltage 1508 can significantly reduce the power consumption of the solenoid 1302. This is all the more important as the time spent using the hold voltage 1508 increases in relation to the energizing voltage 1506.

When the solenoid 1302 needs to be disabled, the gate driver 1316 can apply the disable voltage 1510, allowing the current and the voltage to fall to zero. The control logic 1326 can determine a motion time 1524 between energizing, which is the application of the adjustable voltage ramp 1512, and the drop in current 1514 indicating plunger motion based on BEMF. Specifically, the motion time 1524 can be from the initial adjustable ramp 1512 application to the back electromotive force detected as the drop in current 1514.

Figure 16:
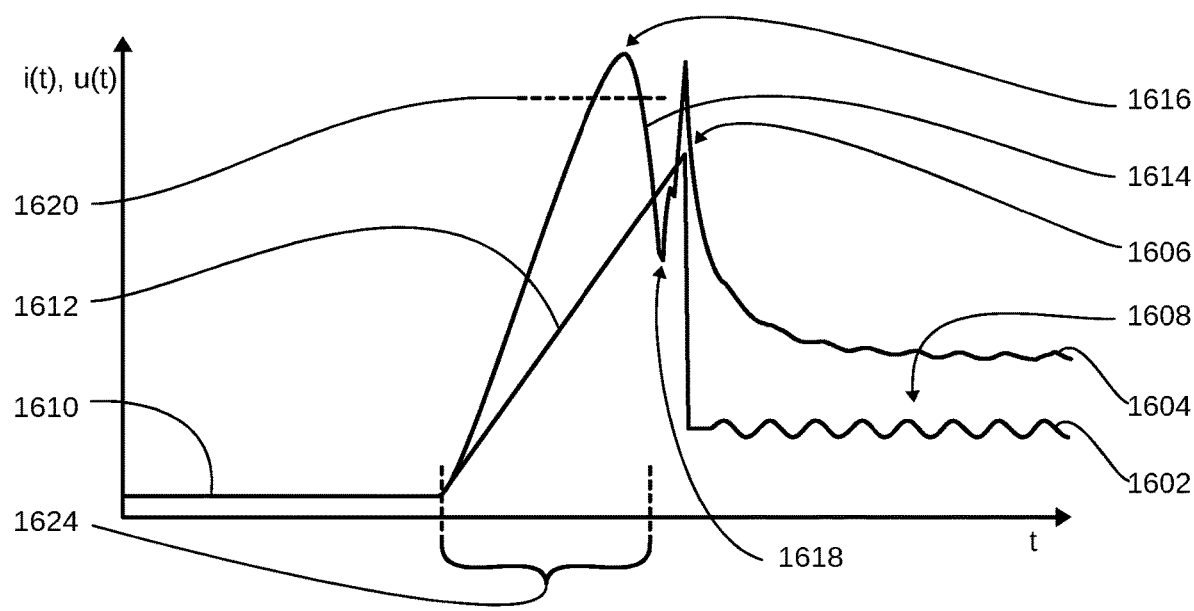
FIG. 16 is a second timing diagram for the solenoid system of FIG. 13.

Referring now to FIG. 16, therein is shown a second timing diagram for the solenoid system 1300 of FIG. 13. The second timing diagram depicts a digital voltage signal 1602 and a digital current signal 1604. The digital voltage signal 1602 can be the signal of voltage or u(t) 1404 of FIG. 14 from the output of the half bridge 1313 of FIG. 13 to the coil 1306 of FIG. 13. The digital current signal 1604 can be the signal of current or i(t) 1410 of FIG. 14 through the solenoid 1302 of FIG. 13 as detected by the current sensor 1322 of FIG. 13.

The digital voltage signal 1602 and the digital current signal 1604 are plotted with respect to a horizontal time axis. The digital voltage signal 1602 is plotted with respect to a vertical voltage axis, such as the u(t) 1404. The digital current signal 1604 is plotted with respect to a vertical current axis, such as the i(t) 1410.

The digital voltage signal 1602 is shown having an energizing voltage 1606, a hold voltage 1608, and a disable voltage 1610. The energizing voltage 1606 can be a large voltage, relative to the voltage ratings of the solenoid 1302. The energizing voltage 1606 should be large enough to ensure movement of the solenoid 1302.

When parameterizing the solenoid system 1300, the largest energizing voltage 1606 required by a solenoid, in a group of solenoids, can be chosen as the energizing voltage 1606. Alternatively, the energizing voltage 1606 can be customized for each solenoid 1302 individually.

As the energizing voltage 1606 is large, an adjustable ramp 1612 can be used to bring the solenoid 1302 up from the disable voltage 1610 to the energizing voltage 1606 without overly stressing the solenoid 1302. The adjustable ramp 1612 can be created by varying the PWM signal provided by the gate driver 1316 of FIG. 13.

The hold voltage 1608 is shown being between the energizing voltage 1606 and the disable voltage 1610. The hold voltage 1608 can be a voltage that holds the plunger 1308 of FIG. 13 in position without movement.

When a group of solenoids are being parameterized, the hold voltage 1608 can be the lowest voltage where all solenoids 1302 in a group are restrained from movement. The hold voltage 1608 can also be determined individually for each solenoid 1302 as the lowest voltage preventing movement of the solenoid 1302.

The second timing diagram depicts the operation of the solenoid system 1300. Starting with the disable voltage 1610, which is usually 0 volts, the integrated solenoid driver 1304 of FIG. 13 can initiate the adjustable ramp 1612 to bring the solenoid 1302 from the disable voltage 1510 to the energizing voltage 1606.

As the adjustable ramp 1612 is applied and the energizing voltage 1606 is reached, the plunger 1308 will move within the solenoid 1302. As is shown, the plunger 1308 moves during the adjustable ramp 1612 and is completed prior to reaching the energizing voltage 1606. Movement of the plunger 1308 will generate a back electromotive force, which can be detected as a drop in current 1614.

As the plunger 1308 begins to move within the solenoid 1302, the back electromotive forces are generated and the drop in current 1614 is detected. The drop in current 1614 is detected by the control logic 1326 of FIG. 13 during the adjustable ramp 1612.

The drop in current 1614 can be measured between a local current maximum 1616 and a local current minimum 1618, both detected by the control logic 1326. The control logic 1326 can measure the drop in current 1614 against a current drop threshold 1620.

The current drop threshold 1620 is shown as a single current value by which the drop in current 1514 is determined by first detecting the i(t) 1410 rising above the current drop threshold 1520 of FIG. 15 and then the i(t) 1410 falling below the current drop threshold 1520 due to the back electromotive force of the plunger 1308. Alternatively, the current drop threshold 1520 could be an amount of the i(t) 1410 change required to detect the drop in current 1514. If the drop in current 1514 is detected, motion of the plunger 1308 is recognized and the integrated solenoid driver 1304 can then reduce the u(t) 1404 from the energizing voltage 1606 to the hold voltage 1608.

In the present embodiment, the hold voltage 1608 is not applied after a wait time but is applied immediately once reaching the energizing voltage 1606. As will be appreciated, the hold voltage 1608 can significantly reduce the power consumption of the solenoid 1302. This is all the more important as the time spent using the hold voltage 1608 increases in relation to the energizing voltage 1606, and as is depicted, the energizing voltage 1606 is terminated immediately for increased power savings.

When the solenoid 1302 needs to be disabled, the gate driver 1316 can apply the disable voltage 1610, allowing the current and the voltage to fall to zero. The control logic 1326 can determine a motion time 1624 between energizing and plunger motion based on BEMF. Specifically, the motion time 1624 can be from the beginning of the adjustable ramp 1612 to the back electromotive force detected as the drop in current 1614.

Figure 17:
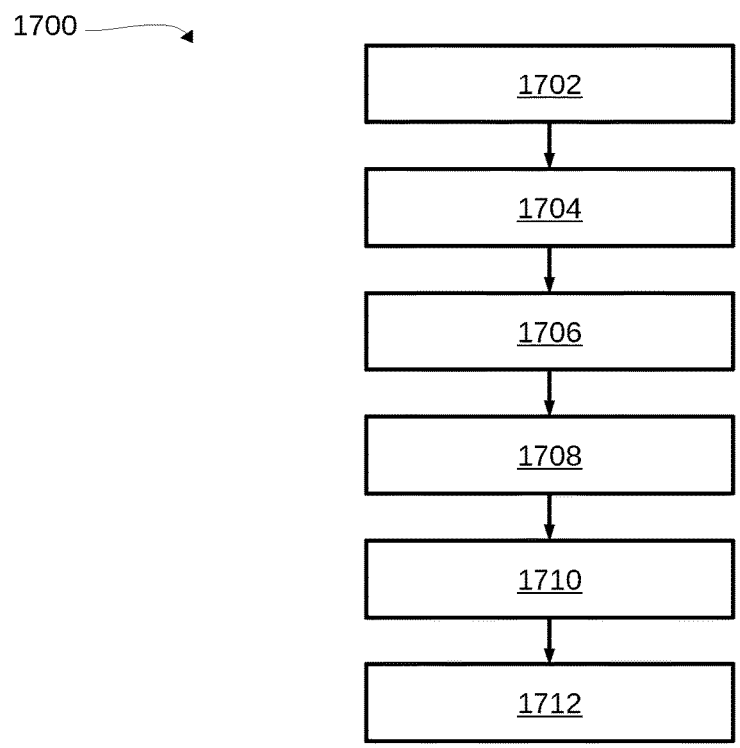
FIG. 17 is a control flow for the solenoid system.

Referring now to FIG. 17, therein is shown a control flow 1700 of a method for operating the solenoid system 1300. The method can include providing an energizing voltage to a coil of a solenoid with a switch controller in a block 1702; detecting a current through the coil of the solenoid with a current sensor coupled to the solenoid in a block 1704; detecting a drop in the current indicating movement of an armature of the solenoid the drop detected with control logic coupled to the current sensor in a block 1706; dropping the energizing voltage to the coil down to a hold voltage with the switch controller based on the control logic detecting the drop in the current, and the hold voltage being below the energizing voltage in a block 1708; providing an error based on the drop in the current being less than a current drop threshold in a block 1710; and providing a disable voltage to the coil placing the solenoid in a non-actuated state, and the hold voltage is between the energizing voltage and the disable voltage in a block 1712.

Thus, it has been discovered that the solenoid system furnishes important and heretofore unknown and unavailable solutions, capabilities, and functional aspects. The resulting configurations are straightforward, cost-effective, uncomplicated, highly versatile, accurate, sensitive, and effective, and can be implemented by adapting known components for ready, efficient, and economical manufacturing, application, and utilization.

Particularly, it has been discovered that providing a hold voltage to a coil of a solenoid based on control logic detecting a drop in the current reflects an unexpected improvement in the functioning of solenoid systems by reducing power and wear during use while still allowing the solenoid to remain in an actuated state, a combination previously unknown, unexpected, and untested. As such the solution is necessarily rooted in electronics technology in order to overcome a problem of high power usage specifically arising in the realm of electronic solenoids by technical means.

The drop in current detected and measured within the control logic by way of a current sensor and an analog-to-digital converter is used to control the technical process and the internal functioning of the control logic itself together with its interfaces including the switch controller and the solenoid. Thus, the drop in current and subsequent application of the hold voltage controls the operation of the solenoid system and inherently comprises and reflects, corresponding technical features of the control logic, the current sensor, the analog-to-digital converter, and the switch controller.

The drop in current provides a robust indication of armature movement and reducing voltage to the coil, from the energizing voltage to the hold voltage based on this drop in current, greatly reduces power consumption of the solenoid to the point where the solenoid could be implemented in remote battery powered systems, such as door locks with extremely low power requirements. In this way power saving is optimized as energizing voltage apply time is minimized.

While the solenoid system has been described in conjunction with a specific best mode, it is to be understood that many alternatives, modifications, and variations will be apparent to those skilled in the art in light of the preceding description. Accordingly, it is intended to embrace all such alternatives, modifications, and variations, which fall within the scope of the included claims. All matters set forth herein or shown in the accompanying drawings are to be interpreted in an illustrative and non-limiting sense.

The solenoid system 1300 can be a low power solenoid system comprising: a solenoid having a coil; a switch controller coupled to the solenoid, the switch controller provides an energizing voltage and a hold voltage, the hold voltage being below the energizing voltage; a current sensor, coupled to the solenoid, the current sensor detects current through the coil; and control logic coupled to the current sensor, the control logic detects a drop in the current, the switch controller drops the energizing voltage to the coil down to the hold voltage based on the control logic detecting the drop in the current, and the control logic provides an error based on the drop in the current being less than a current drop threshold.

Within the low power solenoid system, the control logic compares the current through the coil with a current reference input into the control logic. The low power solenoid system can also include an analog-to-digital converter coupled between the current sensor and the control logic. Within the low power solenoid system, the drop in the current is from a back electromotive force generated by movement of an armature of the solenoid.

The solenoid system 1300 can further be a low power solenoid system comprising: a solenoid having an armature and a coil; a switch controller coupled to the solenoid, the switch controller provides an energizing voltage, a hold voltage, and a disable voltage, the hold voltage being between the energizing voltage and the disable voltage; a current sensor, coupled to the solenoid, the current sensor detects current through the coil; and control logic coupled to the current sensor, the control logic detects a drop in the current indicating movement of the armature, the switch controller drops the energizing voltage to the coil down to the hold voltage based on the control logic detecting the drop in the current, the switch controller provides the disable voltage to the coil placing the solenoid in a non-actuated state, and the control logic provides an error based on the drop in the current being less than a current drop threshold.

The low power solenoid system can also include an N-channel MOSFET half bridge coupled between the switch controller and the solenoid, the N-channel MOSFET half bridge supplies the energizing voltage, the hold voltage, and the disable voltage to the coil based on a pulse-width modulated signal from the switch controller. Within the low power solenoid system, the control logic determines a time between a beginning of an adjustable voltage ramp to the coil and the drop in the current indicating the movement of the armature.

Within the low power solenoid system, the switch controller provides the hold voltage to the coil based on the control logic detecting the drop in the current and based on a wait time elapsing after the drop in the current is detected. Within the low power solenoid system, the switch controller provides an adjustable voltage ramp to the coil from the disable voltage to the energizing voltage.

The solenoid system 1300 can be operated by: providing an energizing voltage to a coil of a solenoid with a switch controller; detecting a current through the coil with a current sensor coupled to the solenoid; detecting a drop in the current with control logic coupled to the current sensor; providing an error based on the drop in the current being less than a current drop threshold; and dropping the energizing voltage to the coil down to a hold voltage with the switch controller based on the control logic detecting the drop in the current, and the hold voltage being below the energizing voltage.

Operating the low power solenoid system can also include comparing the current through the coil with a current reference input into the control logic. Where detecting the current includes detecting the current with an analog-to-digital converter coupled between the current sensor and the control logic. Where detecting the drop in the current includes detecting the drop in the current from a back electromotive force generated by movement of an armature of the solenoid.

Operating the low power solenoid system can also include providing a disable voltage to the coil placing the solenoid in a non-actuated state, the hold voltage being between the energizing voltage and the disable voltage, and wherein detecting the drop in the current indicates movement of an armature of the solenoid. Where providing the energizing voltage, the hold voltage, and the disable voltage includes providing the energizing voltage, the hold voltage, and the disable voltage with an N-channel MOSFET half bridge coupled between the switch controller and the solenoid, and based on a pulse-width modulated signal from the switch controller.

Operating the low power solenoid system can also include determining a time between a beginning of an adjustable voltage ramp to the coil and the drop in the current indicating the movement of the armature. Where providing the hold voltage to the coil with the switch controller based on the control logic detecting the drop in the current further includes providing the hold voltage to the coil based on the control logic detecting the drop in the current and based on a wait time elapsing after the drop in the current is detected. Operating the low power solenoid system can also include providing an adjustable voltage ramp to the coil from the disable voltage to the energizing voltage with the switch controller.

The solenoid system 1300 can abstractly be described as a method and apparatus that can include: providing an energizing voltage to a coil of a solenoid with a switch controller; detecting a current through the coil of the solenoid with a current sensor coupled to the solenoid; detecting a drop in the current indicating movement of an armature of the solenoid the drop detected with control logic coupled to the current sensor; dropping the energizing voltage to the coil down to a hold voltage with the switch controller based on the control logic detecting the drop in the current, and the hold voltage being below the energizing voltage; and providing a disable voltage to the coil placing the solenoid in a non-actuated state, and the hold voltage is between the energizing voltage and the disable voltage.

What is claimed is:

1. A solenoid detection system comprising control logic configured to:
    couple to a switch controller for providing an energizing voltage, the control logic providing an AC signal, the AC signal being superimposed onto the energizing voltage;
    couple to a current sensor for detecting a current through a coil of a solenoid, the current including an AC current amplitude induced by the AC signal and including a DC offset current amplitude;
    determine the AC current amplitude utilizing the AC signal for synchronous demodulation;
    determine the AC current amplitude is a low AC current amplitude based on an armature of the solenoid being in a retracted position, or the AC current amplitude is a high AC current amplitude based on the armature of the solenoid being in an extended position; and
    determine a temperature fault based on the DC offset current amplitude falling below a DC offset current amplitude threshold.

2. The system of claim 1 wherein the control logic determines the AC current amplitude is the low AC current amplitude or the high AC current amplitude by comparing the AC current amplitude with an AC amplitude threshold.

3. The system of claim 1 wherein the control logic providing the AC signal includes the AC signal superimposed on a pulse width modulation (PWM) duty cycle within the switch controller.

4. The system of claim 1 wherein the control logic determines the AC current amplitude by synchronously demodulating a digital current signal with the AC signal, the digital current signal including the AC current amplitude and the DC offset current amplitude.

5. The system of claim 1 wherein the control logic determines the AC current amplitude with a series of samples to determine an average value.

6. A solenoid detection system comprising:
    a current sensor configured to couple to a solenoid with a coil and an armature, the current sensor detects current through the coil;
    a switch controller configured to couple to the coil, the switch controller configured to provide an energizing voltage; and
    control logic coupled to the switch controller, the control logic providing an AC signal, the AC signal being superimposed onto the energizing voltage, the current through the coil including an AC current amplitude induced by the AC signal and including a DC offset current amplitude, and the control logic determines the AC current amplitude utilizing the AC signal for synchronous demodulation, the control logic determines the AC current amplitude is a low AC current amplitude based on the armature being in a retracted position or determines the AC current amplitude is a high AC current amplitude based on the armature being in an extended position, and the control logic determines a temperature fault based on the DC offset current amplitude falling below a DC offset current amplitude threshold.

7. The system of claim 6 wherein the control logic determines the AC current amplitude is the low AC current amplitude or the high AC current amplitude by comparing the AC current amplitude with an AC amplitude threshold.

8. The system of claim 6 wherein the control logic providing the AC signal includes the AC signal superimposed on a pulse width modulation (PWM) duty cycle within the switch controller.

9. The system of claim 6 wherein the control logic determines the AC current amplitude by synchronously demodulating a digital current signal with the AC signal, the digital current signal including the AC current amplitude and the DC offset current amplitude.

10. The system of claim 6 wherein the control logic determines the AC current amplitude with a series of samples to determine an average value.

11. A solenoid detection system comprising:
    a current sensor configured to couple to a solenoid with a coil and an armature, the current sensor detects current through the coil;
    a switch controller configured to couple to the coil, the switch controller configured to provide an energizing voltage, a hold voltage, and a disable voltage, the hold voltage being between the energizing voltage and the disable voltage; and
    control logic coupled to the switch controller and coupled to the current sensor, the control logic providing an AC signal, the AC signal being superimposed onto the energizing voltage, the hold voltage, or the disable voltage, the current through the coil including an AC current amplitude induced by the AC signal and including a DC offset current amplitude, and the control logic determines the AC current amplitude utilizing the AC signal for synchronous demodulation, the control logic determines the AC current amplitude is a low AC current amplitude based on the armature being in a retracted position or determines the AC current amplitude is a high AC current amplitude based on the armature being in an extended position, and the control logic determines a temperature fault based on the DC offset current amplitude falling below a DC offset current amplitude threshold.

12. The system of claim 11 wherein the switch controller is configured to drop the energizing voltage to the coil down to the hold voltage based on the solenoid being actuated in the retracted position and the AC current amplitude determined to be the low AC current amplitude by the control logic.

13. The system of claim 11 wherein the switch controller is configured to drop the energizing voltage to the coil down to the hold voltage based on the solenoid being actuated in the extended position and the AC current amplitude determined to be the high AC current amplitude by the control logic.

14. The system of claim 11 wherein the switch controller is configured to provide an adjustable ramp from the disable voltage to the energizing voltage by varying a pulse width modulation (PWM) duty cycle.

15. The system of claim 11 wherein the switch controller configured to provide the disable voltage is further configured to provide the disable voltage larger than half of a peak-to-peak voltage of the AC signal.

* * * * *